United States Patent
Choi

(10) Patent No.: US 9,170,315 B2
(45) Date of Patent: Oct. 27, 2015

(54) MAGNETIC RESONANCE IMAGING APPARATUS AND METHOD

(71) Applicant: SAMSUNG ELECTRONICS CO., LTD., Suwon-si (KR)

(72) Inventor: Sang-cheon Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/522,031

(22) Filed: Oct. 23, 2014

(65) Prior Publication Data

US 2015/0108985 A1    Apr. 23, 2015

(30) Foreign Application Priority Data

Oct. 23, 2013   (KR) .................. 10-2013-0126726
Oct. 22, 2014   (KR) .................. 10-2014-0143408

(51) Int. Cl.
  *G01R 33/561*   (2006.01)
  *G01R 33/48*    (2006.01)
  *G01R 33/385*   (2006.01)
  *G06T 5/00*     (2006.01)

(52) U.S. Cl.
  CPC ........ *G01R 33/5611* (2013.01); *G01R 33/3852* (2013.01); *G01R 33/4818* (2013.01); *G06T 5/002* (2013.01); *G06T 2207/10088* (2013.01); *G06T 2207/20182* (2013.01)

(58) Field of Classification Search
  CPC ........... G01R 33/3852; G01R 33/4818; G01R 33/5611; G06T 5/002; G06T 2207/10088; G06T 2207/20182
  See application file for complete search history.

(56) References Cited

U.S. PATENT DOCUMENTS

| | | | |
|---|---|---|---|
| 5,825,185 A | 10/1998 | Liu et al. | |
| 6,841,998 B1 | 1/2005 | Griswold | |
| 7,279,895 B2 | 10/2007 | Wang et al. | |
| 7,319,324 B2 | 1/2008 | KannengieBer et al. | |
| 7,486,839 B2 * | 2/2009 | Moriguchi et al. | 382/280 |
| 8,901,927 B2 * | 12/2014 | Gross | 324/309 |
| 8,917,798 B2 * | 12/2014 | Garudadri et al. | 375/316 |
| 2008/0007250 A1 | 1/2008 | Wiggins | |

(Continued)

FOREIGN PATENT DOCUMENTS

| | | |
|---|---|---|
| JP | 10-155769 A | 6/1998 |
| JP | 2013-192957 A | 9/2013 |
| KR | 10-1283532 B1 | 7/2013 |

OTHER PUBLICATIONS

Mark A. Griswold et al., "Generalized Autocalibrating Partially Parallel Acquisitions (GRAPPA)", Magnetic Resonance in Medicine, 2002, pp. 1202-1210.

(Continued)

*Primary Examiner* — Dixomara Vargas
(74) *Attorney, Agent, or Firm* — Sughrue Mion, PLLC

(57) ABSTRACT

Disclosed are a magnetic resonance imaging (MRI) apparatus and method. The MRI apparatus includes a data acquirer, which performs under-sampling of MR signals, respectively received from a plurality of channel coils included in a radio frequency (RF) multi-coil, at non-uniform intervals to acquire a plurality of pieces of line data, and an image processor that restores a plurality of pieces of K-space data respectively corresponding to the plurality of channel coils by using a relationship between the acquired plurality of pieces of line data, thereby restoring an MR image with reduced aliasing artifacts.

30 Claims, 13 Drawing Sheets

(56) References Cited

U.S. PATENT DOCUMENTS

2009/0012385 A1 1/2009 Takizawa et al.
2009/0196478 A1 8/2009 Lustig et al.
2011/0286648 A1 11/2011 Sharif et al.
2013/0249549 A1 9/2013 Pfeuffer et al.

OTHER PUBLICATIONS

Jaeseok Park et al., "Artifact and Noise Suppression in GRAPPA Imaging Using Improved k-Space Coil Calibration and Variable Density Sampling", Magnetic Resonance in Medicine, vol. 53, No. 1, Jan. 1, 2005, 8 pages.
Suhyung Park et al., "Adaptive Self-Calibrating Iterative GRAPPA Reconstruction", Magnetic Resonance in Medicine, vol. 67, No. 6, Oct. 12, 2011, 10 pages.
Li et al., "Parallel imaging using a non-uniform undersampling trajectory", Proc. Intl. Soc. mag. Reson. Med., 19, May 7, 2011, 1 page.
Weller et al., "Combined Compressed Sensing and Parallel MRI Compared for Uniform and Random Cartesian Undersampling of K-Space", Slides of a lecture given at the 2011 IEEE International Conference on Acoustics, Speech and Signal Processing (ICASSP), May 26, 2011, 54 pages.
Lai et al., "Improving Compressed Sensing Parallel Imaging using Autocalibrating Parallel Imaging Initialization with Variable Density Tiled Random k-space Sampling", Proceedings of the International Society for Magnetic Resonance in Medicine, 19th Annual Meeting and Exhibition, May 7-13, 2011, vol. 19, Apr. 23, 2011, 1 page.
Huang et al., "A theoretical analysis of errors in GRAPPA", Proc. Intl. Soc. Mag. Reson. Med. 14, May 6, 2006, 1 page.
Communication, Issued by the International Searching Authority, Dated Jan. 14, 2015, in counterpart International Application No. PCT/KR2014/009985.
Communication, Issued by the European Patent Office, Dated Mar. 3, 2015, in counterpart European Application No. 14190034.0.

* cited by examiner

FIG. 4A

- Acquied line
- ACS
- ○ Missing line $$\begin{bmatrix} \bullet & \bullet & \bullet & \bullet & \bullet & \cdots & \bullet \\ \bullet & \bullet & \bullet & \bullet & \bullet & & \cdot \\ \bullet & \bullet & \bullet & \bullet & \bullet & & \cdot \\ \cdot & \cdot & \cdot & \cdot & \cdot & & \cdot \\ \cdot & \cdot & \cdot & \cdot & \cdot & & \cdot \\ \bullet & \bullet & \bullet & \bullet & \bullet & \cdots & \bullet \end{bmatrix} \cdot kc = \begin{bmatrix} \bullet \\ \bullet \\ \bullet \\ \cdot \\ \cdot \\ \bullet \end{bmatrix}$$

—410  —420

(a)

- Acquied line
- ACS
- ○ Missing line $$\begin{bmatrix} \bullet & \bullet & \bullet & \bullet & \bullet & \cdots & \bullet \\ \bullet & \bullet & \bullet & \bullet & \bullet & & \cdot \\ \bullet & \bullet & \bullet & \bullet & \bullet & & \cdot \\ \cdot & \cdot & \cdot & \cdot & \cdot & & \cdot \\ \cdot & \cdot & \cdot & \cdot & \cdot & & \cdot \\ \bullet & \bullet & \bullet & \bullet & \bullet & \cdots & \bullet \end{bmatrix} \cdot kc = \begin{bmatrix} \circ \\ \circ \\ \circ \\ \cdot \\ \cdot \\ \circ \end{bmatrix}$$

—430  —440

(b)

FIG. 4B (a) $$S_{g,j}(k_y+B(n-1),k_x) = \sum_{c=1}^{N_c}\sum_{b=1}^{N_b}\sum_{h=-N_l}^{N_r} W_{g,j,r}(c,b,h) \times S_{g,c}(k_y+M(b,r),k_x+h\Delta k_x)$$

(b) g : block group, j : coil number, B : block size, n: block number in a group,
$N_c$ : number of coils, $N_b$ : number of blocks near current block,
$N_r$, $N_l$ : the bumber of left and right neighbor frequency encoding data.
$W_{g,j,r}$ : net weights of the r-th net of coil j in g group
r : acceleration factor, M(b, r) : non − unform sampling mask with r in b block (c) $$K_c = K_{g,j,r} = \begin{bmatrix} W_{1,1,-N_l} & W_{2,1,-N_l} & \cdots & W_{N_c,1,-N_l} \\ W_{1,2,-N_l+1} & W_{2,2,-N_l+1} & \cdots & W_{N_c,2,-N_l+1} \\ \vdots & & \ddots & \vdots \\ W_{1,2,N_r} & W_{2,N_b,N_r} & \cdots & W_{N_c,N_b,N_r} \end{bmatrix}$$

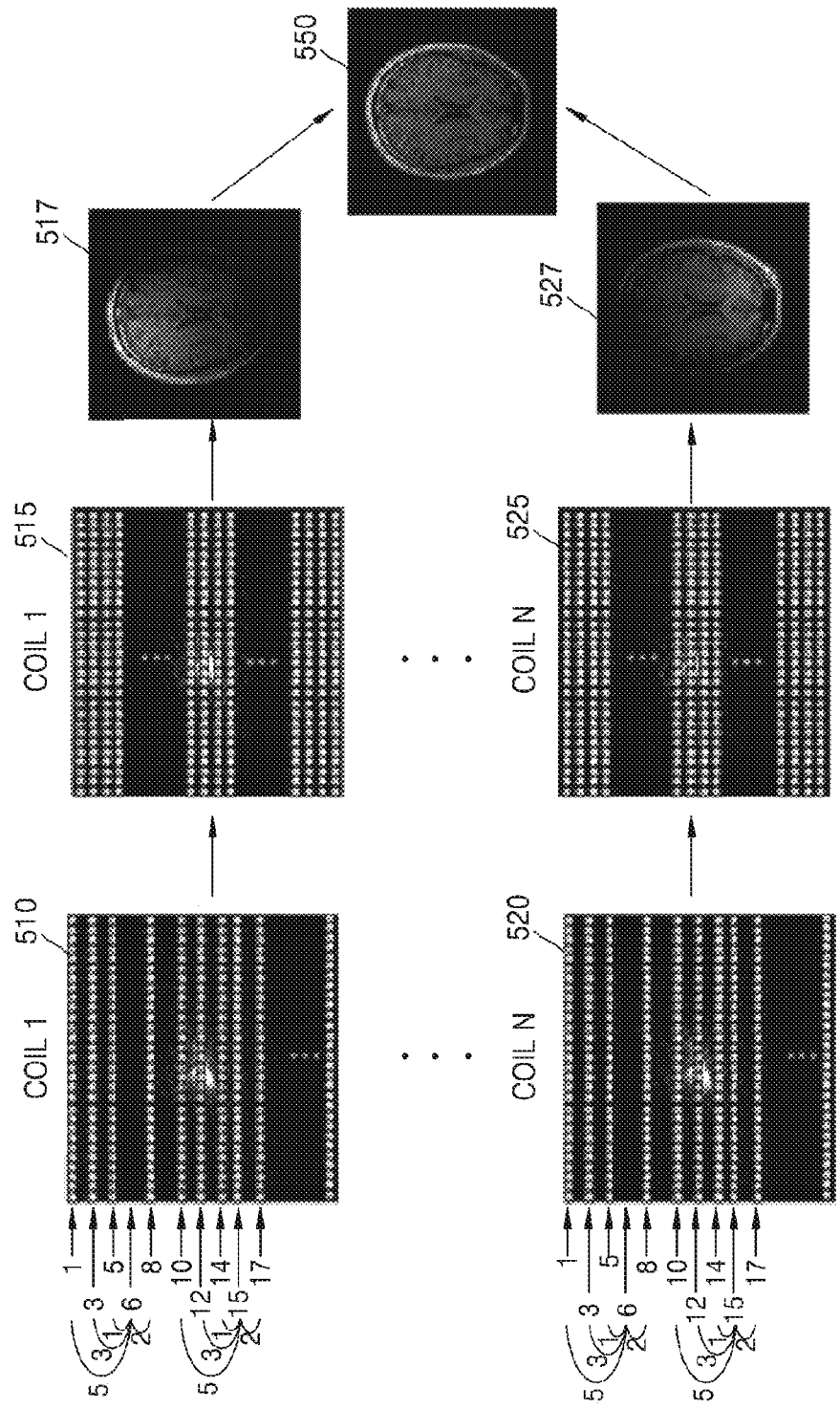

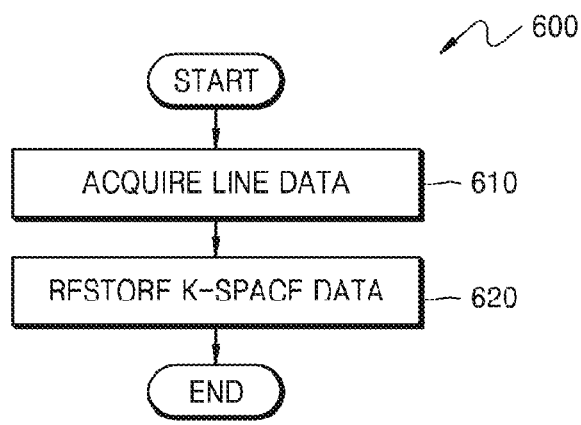
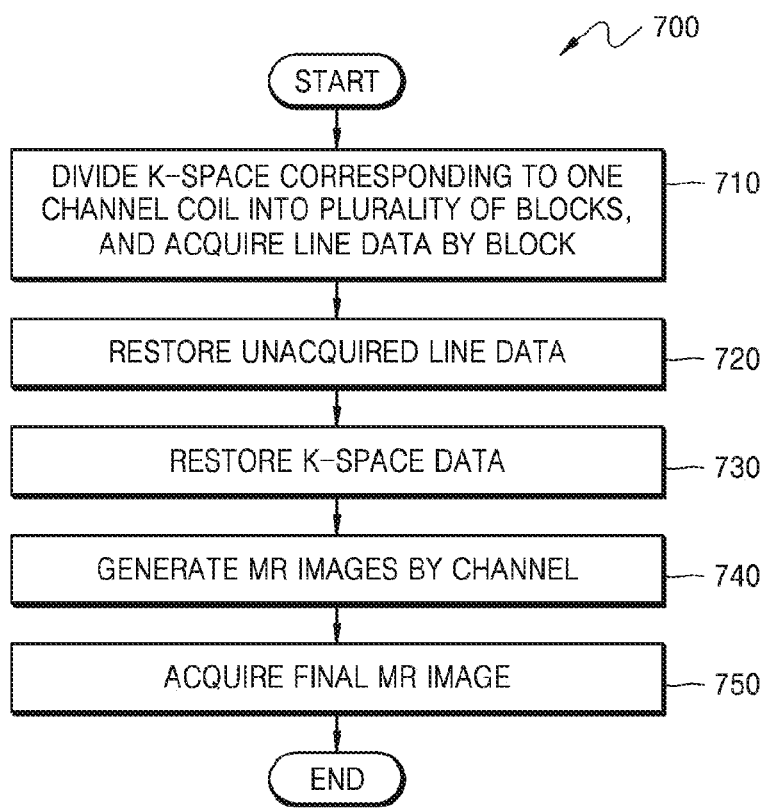

FIG. 12

MAGNETIC RESONANCE IMAGING APPARATUS AND METHOD

CROSS-REFERENCE TO RELATED APPLICATIONS

This application claims priority from Korean Patent Application No. 10-2013-0126726, filed on Oct. 23, 2013 and Korean Patent Application No. 10-2014-0143408, filed on Oct. 22, 2014, in the Korean Intellectual Property Office, the disclosure of which is incorporated herein in its entirety by reference.

BACKGROUND

1. Field

One or more embodiments of the present invention relate to a magnetic resonance imaging (MRI) apparatus and method, and more particularly, to an MRI apparatus and method that perform under-sampling on a plurality of pieces of K-space data acquired by a radio frequency (RF) multi-coil to acquire an MR image.

2. Description of the Related Art

A magnetic resonance imaging (MRI) apparatus is an apparatus that photographs an object by using a magnetic field. An MRI apparatus is capable of illustrating lumbar discs, joints, and nerve ligaments, in addition to bones, three-dimensionally at a desired angle. These apparatuses are therefore widely used for an accurate diagnosis of a disease.

An MRI apparatus acquires a magnetic resonance (MR) signal, reconfigures the acquired MR signal into an image, and outputs the image. Specifically, an MRI apparatus acquires the MR signal by using radio frequency (RF) coils, a permanent magnet, and a gradient coil.

Specifically, by using a pulse sequence used to generate an RF signal, an MRI apparatus applies the RF signal to an object through an RF multi-coil, and performs sampling on an MR signal generated in response to the applied RF signal to restore an MR image.

At present, about one hour is used for capturing an MR image. Generally, the MRI apparatus is implemented as a long and narrow tube (hereinafter referred to as an MRI tube). Therefore, a patient to be photographed for obtaining an MR image enters an MRI tube, and should not move while photographing. Due to this, it is difficult to capture an MR image of a critical patient or a claustrophobe, and moreover, even for general patients, a photographing time becomes longer, causing boredom and inconvenience.

Therefore, an image processing apparatus and method for shortening a capturing time of an MR image are needed.

A method, which does not perform sampling of an MR signal for all lines of a K-space image but performs under-sampling that performs sampling of the MR signal at some line intervals of the K-space image, and calibrates the under-sampled K-space data to perform imaging on a final MR image, may be used to shorten a capturing time of an MR image.

Specifically, a generalized auto-calibrating partially parallel acquisition (GRAPPA) method, which is an example of a k-space-based imaging method, performs self-calibration to calculate a spatial correlation or convolution kernel coefficient that is a spatial interaction value between a calibration signal and a measured source signal adjacent thereto, and estimates an unmeasured signal by using the calculated spatial correlation coefficient.

In detail, the GRAPPA method restores unobtained k-space lines by channel by using a measured signal that is under-sampled data and additionally acquired auto-calibration signal (ACS) line data.

In restoring k-space data by performing calibration, when data of an image signal is damaged or a spatial interaction value is changed due to noise, aliasing artifacts and amplified noise of a finally acquired MR image occur.

Therefore, it is required to provide an imaging method and apparatus that decreases the number of aliasing artifacts, and restores an MR image with an improved quality by removing amplified noise.

However, due to tradeoff, it is difficult to satisfy all the above-described requirements for reducing a time taken in capturing an MR image and for improving a quality of a restored MR image.

SUMMARY

One or more embodiments of the present invention include an MRI apparatus and method, which improve a quality of a restored MR image.

One or more embodiments of the present invention include an MRI apparatus and method, which prevent a quality of an image from being degraded due to aliasing artifacts, thus improving a quality of a restored MR image.

One or more embodiments of the present invention include an MRI apparatus and method, which acquire K-space data through under-sampling, thus quickly acquiring an MR image.

One or more embodiments of the present invention include an MRI apparatus and method, which quickly acquire an MR image with an improved quality even without using an additional calibration signal, which is acquired from a partial region of a K-space and used in a GRAPPA technique or using a coil sensitivity map that has additional coil information and is used in a simultaneous acquisition of spatial harmonics (SMASH) technique.

Additional aspects will be set forth in part in the description which follows and, in part, will be apparent from the description, or may be learned by practice of the presented embodiments.

According to one or more embodiments of the present invention, a magnetic resonance imaging (MRI) apparatus includes: a data acquirer that performs under-sampling of magnetic resonance (MR) signals, respectively received from a plurality of channel coils included in a radio frequency (RF) multi-coil, at non-uniform intervals to acquire a plurality of pieces of line data; and an image processor that restores a plurality of pieces of K-space data respectively corresponding to the plurality of channel coils by using a relationship between the acquired plurality of pieces of line data.

The data acquirer may perform under-sampling of the MR signals at non-uniform intervals in a whole K-space corresponding to each of the plurality of channel coils.

The data acquirer may divide a K-space corresponding to one channel coil into a plurality of blocks, and performs under-sampling of a corresponding MR signal for each of the plurality of blocks at non-uniform intervals to acquire the plurality of pieces of line data.

A non-uniform under-sampling pattern, which is generated based on the pieces of line data which are acquired by performing the under-sampling at non-uniform intervals, may be the same in the plurality of blocks.

The plurality of blocks may include the same under-sampling interval pattern.

By using the relationship between the acquired plurality of pieces of line data, the image processor may restore a plurality of pieces of unacquired line data, and by using at least one of the restored plurality of pieces of line data and the acquired plurality of pieces of line data, the image processor may restore K-space data corresponding to the one channel coil.

The image processor may set one of the acquired plurality of pieces of line data to reference line data, and when spatial distances between the reference line data and at least two of the acquired plurality of pieces of line data have a first relationship, the image processor may restore the plurality of pieces of unacquired line data by using the first relationship.

The image processor may restore unacquired line data having the first relationship with at least two of the acquired plurality of pieces of line data, and restore unacquired line data having the first relationship with at least one of the restored plurality of pieces of line data and at least one of the acquired plurality of pieces of line data.

By using the reference line data and at least two of the acquired plurality of pieces of line data, the image processor may calculate a spatial correlation coefficient corresponding to the first relationship, and by using the spatial correlation coefficient, the image processor may restore unacquired line data.

The image processor may sequentially restore a plurality of pieces of unacquired line data, included in each of the plurality of blocks, in a predetermined order.

A plurality of non-uniform under-sampling patterns, which are generated based on the pieces of line data which are acquired by performing the under-sampling at non-uniform intervals, may differ in the plurality of blocks.

The plurality of blocks may be divided into a plurality of groups, and the plurality of groups may include different under-sampling interval patterns.

The plurality of blocks may include at least one first block and at least one second block, and the first and second blocks may include different under-sampling interval patterns.

The first block may include more or less of the acquired plurality of pieces of line data than the second block.

The plurality of blocks may include at least one first block, at least one second block, and at least one third block, the second block may include less of the acquired plurality of pieces of line data than the first block, and the third block may include more of the acquired plurality of pieces of line data than the first block.

The third block may be disposed closer to a center line of the K-space than the first and second blocks.

The image processor may perform a spatial transform on the restored plurality of pieces of K-space data to generate a plurality of MR images by channel, and acquire a final MR image by using the plurality of MR images by channel.

The image processor may perform an inverse Fourier transform on the restored plurality of pieces of K-space data to generate the plurality of MR images by channel.

The image processor may calculate a sum of squares or complex sum of the plurality of MR images by channel to generate the final MR image.

The number of the blocks and a size of each of the blocks may be set based on at least one selected from a hardware type of the RF multi-coil and a part of an object to be photographed.

A non-uniform under-sampling pattern, which is generated based on the pieces of line data which are acquired by performing the under-sampling at non-uniform intervals, may be set based on at least one selected from a hardware type of the RF multi-coil and a part of an object to be photographed.

According to one or more embodiments of the present invention, a magnetic resonance imaging (MRI) apparatus includes: a data acquirer that performs under-sampling on magnetic resonance (MR) signals, respectively received from a plurality of channel coils included in a radio frequency (RF) multi-coil, at non-uniform intervals in a whole K-space corresponding to one of the channel coils to acquire a plurality of pieces of line data; and an image processor that restores a plurality of pieces of K-space data respectively corresponding to the plurality of channel coils on a basis of a spatial correlation coefficient which is calculated by using at least one of a plurality of pieces of line data acquired in a center region of the K-space and at least one of a plurality of pieces of line data acquired in a peripheral region of the K-space.

The data acquirer may divide the K-space into a plurality of blocks, and set, as a calibration block, a first block which is disposed in the center region of the K-space.

The data acquirer may perform sampling on all lines in the calibration block to acquire a plurality of pieces of calibration line data, the data acquirer may perform under-sampling at first intervals to acquire a plurality of pieces of first line data in the whole K-space, and the data acquirer may additionally perform sampling on at least one second line to further acquire at least one piece of second line data in the second block disposed in the peripheral region of the K-space.

The image processor may acquire a spatial correlation coefficient by using the plurality of pieces of calibration line data, the plurality of pieces of first line data, and the at least one piece of second line data.

According to one or more embodiments of the present invention, a magnetic resonance imaging (MRI) apparatus includes: a data acquirer that performs under-sampling of magnetic resonance (MR) signals, which are respectively received from a plurality of channel coils included in a radio frequency (RF) multi-coil, at non-uniform intervals in a whole K-space corresponding to each of the plurality of channel coils to acquire pieces of line data; and an image processor that restores complete K-space data corresponding to each of the plurality of channel coils by using a relationship between the pieces of line data which are acquired by performing the under-sampling at non-uniform intervals.

According to one or more embodiments of the present invention, a MR imaging method using a radio frequency (RF) multi-coil, including a plurality of channel coils, includes: performing under-sampling of MR signals, respectively received from the plurality of channel coils, at non-uniform intervals to acquire a plurality of pieces of line data; and restoring a plurality of pieces of K-space data respectively corresponding to the plurality of channel coils by using a relationship between the acquired plurality of pieces of line data.

The acquiring of the pieces of line data may include performing under-sampling of the MR signals at non-uniform intervals in a whole K-space corresponding to each of the plurality of channel coils to acquire the pieces of line data.

The acquiring of a plurality of pieces of line data may include dividing a K-space corresponding to each of the plurality of channel coils into a plurality of blocks, and performing under-sampling of a corresponding MR signal for each of the plurality of blocks at non-uniform intervals to acquire the plurality of pieces of line data.

A non-uniform under-sampling pattern, which is generated based on the pieces of line data which are acquired by performing the under-sampling at non-uniform intervals, may be the same in the plurality of blocks.

The restoring of a plurality of pieces of K-space data may include: restoring a plurality of pieces of unacquired line data by using the relationship between the acquired plurality of pieces of line data; and restoring K-space data corresponding to the one channel coil by using at least one of the restored plurality of pieces of line data and the acquired plurality of pieces of line data.

The restoring of a plurality of pieces of K-space data may include: setting one of the acquired plurality of pieces of line data to reference line data; and when spatial distances between the reference line data and at least two of the acquired plurality of pieces of line data have a first relationship, restoring the plurality of pieces of unacquired line data by using the first relationship.

The restoring of the plurality of pieces of unacquired line data may include: restoring unacquired line data having the first relationship with at least two of the acquired plurality of pieces of line data; and restoring unacquired line data having the first relationship with at least one of the restored plurality of pieces of line data and the acquired plurality of pieces of line data.

The restoring of the plurality of pieces of unacquired line data may include: calculating a spatial correlation coefficient corresponding to the first relationship by using the reference line data and at least two of the acquired plurality of pieces of line data; and restoring unacquired line data by using the spatial correlation coefficient.

The restoring of the plurality of pieces of unacquired line data may include sequentially restoring a plurality of pieces of unacquired line data, included in each of the plurality of blocks, in a predetermined order.

A plurality of non-uniform under-sampling patterns, which are generated based on the pieces of line data which are acquired by performing the under-sampling at non-uniform intervals, may differ in the plurality of blocks.

The plurality of blocks may include at least one first block and at least one second block, and the first and second blocks may include different under-sampling interval patterns.

The first block may include more than or less of the acquired plurality of pieces of line data than the second block.

The plurality of blocks may include at least one first block, at least one second block, and at least one third block, and the first to third blocks may include different under-sampling interval patterns.

The second block may include less of the acquired plurality of pieces of line data than the first block, and the third block may include more of the acquired plurality of pieces of line data than the first block.

The third block may be disposed closer to a center line of the K-space than the first and second blocks.

The method may further include: performing a spatial transform on the restored plurality of pieces of K-space data to generate a plurality of MR images by channel; and acquiring a final MR image by using the plurality of MR images by channel.

The generating of a plurality of MR images may include performing an inverse Fourier transform on the restored plurality of pieces of K-space data to generate the plurality of MR images by channel.

The acquiring of a final MR image may include calculating a sum of squares or complex sum of the plurality of MR images by channel to generate the final MR image.

The number of the blocks and a size of each of the blocks may be set based on at least one selected from a hardware type of the RF multi-coil and a part of an object to be photographed.

A non-uniform under-sampling pattern, which is generated based on the pieces of line data which are acquired by performing the under-sampling at non-uniform intervals, may be set based on at least one selected from a hardware type of the RF multi-coil and a part of an object to be photographed.

According to one or more embodiments of the present invention, a method of acquiring a magnetic resonance (MR) image by using a radio frequency (RF) multi-coil including a plurality of channel coils includes: performing under-sampling of MR signals, which are respectively received from the plurality of channel coils, at non-uniform intervals in a whole K-space corresponding to each of the plurality of channel coils to acquire pieces of line data; and restoring complete K-space data corresponding to each of the plurality of channel coils by using a relationship between the pieces of line data which are acquired by performing the under-sampling at non-uniform intervals.

According to one or more embodiments of the present invention, a method of acquiring a magnetic resonance (MR) image by using a radio frequency (RF) multi-coil including a plurality of channel coils includes: performing under-sampling of MR signals, which are respectively received from the plurality of channel coils, at non-uniform intervals in a whole K-space corresponding to each of the plurality of channel coils to acquire pieces of line data; and restoring pieces of K-space data respectively corresponding to the plurality of channel coils, based on a spatial correlation coefficient which is calculated by using at least one of pieces of line data acquired in a center region of the K-space and at least one of pieces of line data acquired in a peripheral region of the K-space.

BRIEF DESCRIPTION OF THE DRAWINGS

These and/or other aspects will become apparent and more readily appreciated from the following description of the embodiments, taken in conjunction with the accompanying drawings in which:

FIG. 4A is a diagram for describing an operation of the MRI apparatus according to an embodiment of the present invention;

FIG. 4B is a diagram for describing a weighting matrix;

FIG. 5 is another diagram for describing an operation of the MRI apparatus according to an embodiment of the present invention;

FIG. 6 is a flowchart of an MR imaging method according to an embodiment of the present invention;

FIG. 7 is a flowchart of an MR imaging method according to another embodiment of the present invention;

FIG. 12 is a diagram for describing an operation of acquiring a spatial correlation coefficient in the MRI apparatus according to another embodiment of the present invention.

DETAILED DESCRIPTION

Figure 1:
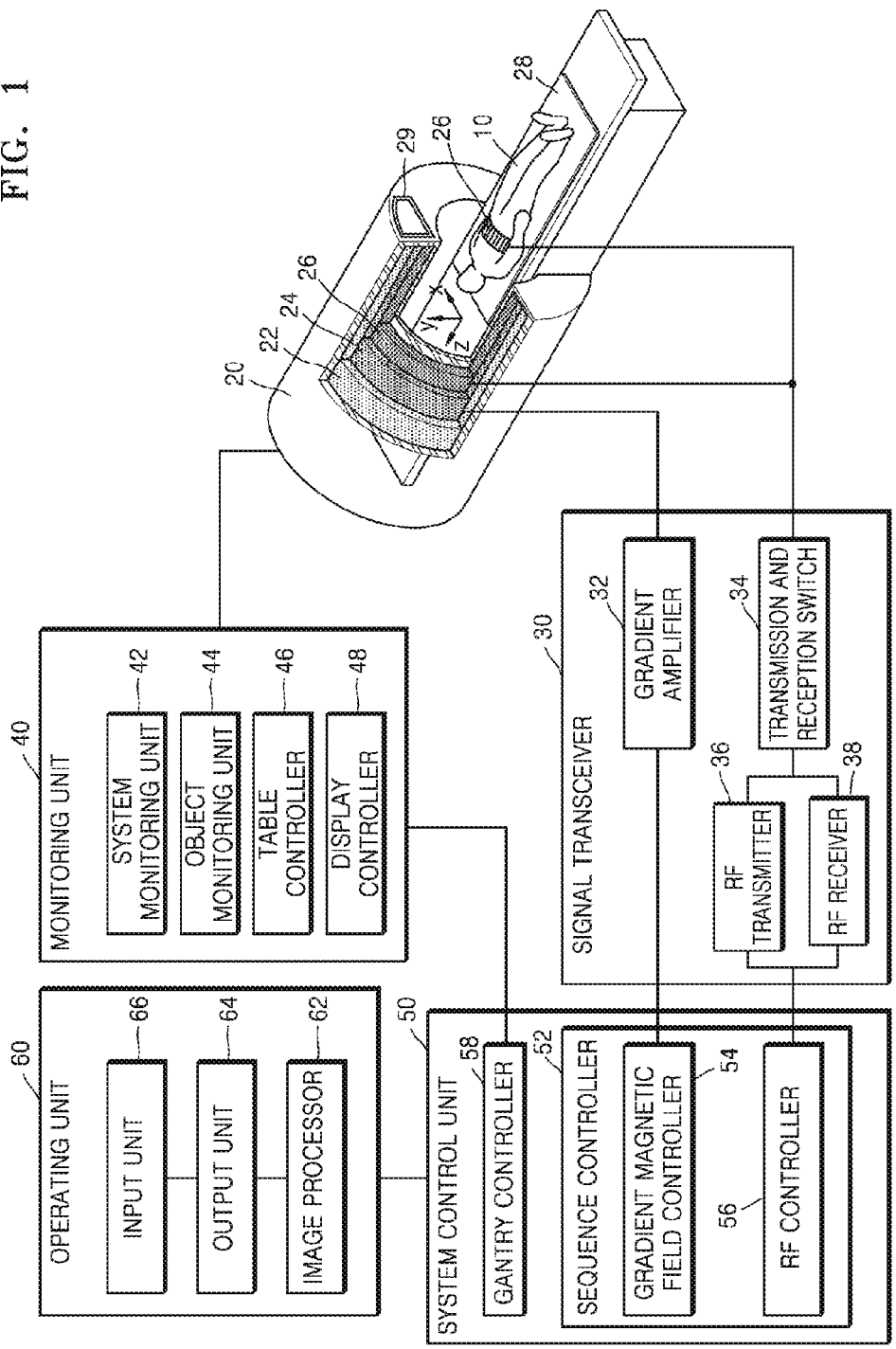
FIG. 1 is a schematic diagram illustrating a general MRI system.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list.

The advantages, features and aspects of the present invention will become apparent from the following description of the embodiments with reference to the accompanying drawings, which is set forth hereinafter. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Terms used herein will be briefly described, and the present invention will be described in detail.

Terms used in the present invention have been selected as general terms which are widely used at present, in consideration of the functions of the present invention, but may be altered according to the intent of a person skilled in the art, conventional practice, or introduction of new technology. Also, if there is a term which is arbitrarily selected by the applicant in a specific case, the meaning thereof will be described in detail in a corresponding description portion of the present invention. Therefore, the terms should be defined on the basis of the entire content of this specification instead of a simple name of each of the terms.

In this disclosure below, when it is described that one comprises (or includes) or when it is described that one comprises (or includes or has) some elements, it should be understood that it may comprise (or include or has) only those elements, or it may comprise (or include or have) other elements as well if there is no specific limitation. The term "module", as used herein, means, but is not limited to, a software or hardware component, such as a Field Programmable Gate Array (FPGA) or an Application Specific Integrated Circuit (ASIC), which performs certain tasks. A module may advantageously be configured to reside in the addressable storage medium and may be configured to be executed on one or more processors. Thus, a module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and modules may be combined into fewer components and modules or further separated into additional components and modules.

Exemplary embodiments of the present invention that are capable of being easily embodied by those skilled in the art will now be described in detail with reference to the accompanying drawings. In the accompanying drawings, a portion irrelevant to a description of the present invention will be omitted for clarity.

The term "image" used herein may denote multi-dimensional data composed of discrete image factors (for example, pixels in a two-dimensional (2D) image and pixels in a three-dimensional (3D) image). For example, an image may include a medical image of an object which is acquired by an X-ray apparatus, a computed tomography (CT) apparatus, a magnetic resonance imaging (MRI) apparatus, an ultrasonic apparatus, or another medical image photographing apparatus.

Moreover, the term "object" used herein may include a person, an animal, a part of the person, or a part of the animal. For example, an object may include an organ such as a liver, a heart, a womb, a brain, breasts, an abdomen, or the like, or a blood vessel. Also, the term "object" may include a phantom. The phantom denotes a material having a volume that is very close to a density of organisms and an effective atomic number, and may include a spherical phantom having a temper similar to a human body.

Moreover, the term "user" used herein is a medical expert, and may be a doctor, a nurse, a medical technologist, a medical image expert, or the like, or may be an engineer repairing a medical apparatus. However, the user is not limited thereto.

Moreover, the wording "MRI image" used herein denotes an image of an object which is obtained by using the nuclear magnetic resonance principle.

Moreover, the term "pulse sequence" used herein denotes a continuation of a repeatedly applied signal in an MRI apparatus. The pulse sequence may include a time parameter of a radio frequency (RF) pulse, for example, a repetition time (TR) and a time of echo (TE).

An MRI system is equipment that expresses an intensity of a magnetic resonance (MR) signal in response to an applied RF signal. The MR signal is generated in a magnetic field having a specific intensity as a contrast, and thus an image of a tomographic part of an object can be obtained. For example, an object is laid in a strong magnetic field. When the RF signal, which only resonates a specific atomic nucleus (for example, a hydrogen atomic nucleus or the like) that is subjected to a particular static magnetic field, is irradiated on the object and then stopped, an MR signal is emitted from the specific atomic nucleus. In this case, the MRI system receives the MR signal to obtain an MR image. The MR signal denotes an RF signal emitted from the object. A level of the MR signal may be decided by a concentration of a specific atom (for example, hydrogen or the like) of the object, a relaxation time $T_1$, a relaxation time $T_2$, and blood flow.

An MRI system has different features compared to other imaging apparatuses. Unlike imaging apparatuses such as CT apparatuses, in which acquisition of an image is dependent on a direction of detection hardware, the MRI system may acquire a two-dimensional (2D) image or a three-dimensional (3D) volume image which is oriented to an arbitrary point.

Also, unlike CT apparatuses, X-ray apparatuses, position emission tomography (PET) apparatuses, and SPECT apparatuses, the MRI system may acquire an image having high soft tissue without exposing an object to dangerous radiation, and thus acquire a neurological image, an intravascular image, a musculoskeletal image, and an oncologic image which need a clear description of an abnormal tissue.

FIG. 1 is a schematic diagram illustrating a general MRI system. Referring to FIG. 1, the general MRI system may include a gantry 20, a signal data acquirer 30, i.e., a signal transceiver, a monitor 40, i.e., a monitoring unit, a system controller 50, i.e., a system control unit, and an operating unit 60.

The gantry 20 prevents or limits an electromagnetic wave, generated by a main magnet 22, a gradient coil 24, and/or a radio frequency (RF) coil 26, from being emitted to the outside. A static electromagnetic field and a gradient magnetic field are generated at a bore of the gantry 20, and an RF signal is irradiated toward an object 10 and a MR signal is received from object 10 using the RF coil 26.

The main magnet 22, the gradient coil 24, and the RF coil 26 may be disposed along a certain direction of the gantry 20. The certain direction may include a coaxial cylinder direction. The object 10 may be located on a table 28, which is insertable into a cylinder along a horizontal axis of the cylinder.

The main magnet 22 generates a static magnetic field for aligning magnetic dipole moments of atomic nucleuses of the object 10 in a given direction. As the static magnetic field generated by the main magnet 22 becomes stronger and more uniform, a more precise and accurate MR image of the object 10 is acquired.

The gradient coil 24 includes X, Y, and Z coils that respectively generate gradient magnetic fields in X-axis, Y-axis, and Z-axis directions that are orthogonal to each other. The gradient coil 24 may induce different resonance frequencies for each part of the object 10, and provide position information of each part of the object 10.

The RF coil 26 may irradiate an RF signal on a patient as the object 10, and receive an MR signal emitted from the patient. Specifically, the RF coil 26 may transmit an RF signal, having the same frequency as that of a precessional motion, to the patient toward an atomic nucleus performing the precessional motion, stop the transmission of the RF signal, and receive an MR signal emitted from the patient.

For example, in order to excite a specific atomic nucleus from a low energy level to a high energy level, the RF coil 26 may generate an electromagnetic wave signal (for example, an RF signal) having an RF corresponding to a kind of the specific atomic nucleus, and apply the electromagnetic wave signal to the object 10. When the electromagnetic wave signal generated by the RF coil 26 is applied to a specific atomic nucleus, the specific atomic nucleus may be excited from a low energy level to a high energy level. Then, when the electromagnetic wave signal generated by the RF coil 26 dissipates, an energy level of the specific atomic nucleus to which the electromagnetic wave is applied may be changed from the high energy level to the low energy level, and an electromagnetic wave having a Larmor frequency may be emitted. The RF coil 26 may receive an electromagnetic wave signal emitted from internal atomic nuclei of the object 10.

The RF coil 26 may be implemented as one RF transmission/reception coil that has the function of generating an RF electromagnetic wave targeted at a kind of atomic nucleus and a function of receiving an electromagnetic wave emitted from the atomic nucleus. Alternatively, the RF coil 26 may include a transmission RF coil that has the function of generating an RF electromagnetic wave targeted at a kind of atomic nucleus and a reception RF coil that has a function of receiving an electromagnetic wave emitted from the atomic nucleus.

Moreover, the RF coil 26 may be fixed to the gantry 20, or is detachably attached to the gantry 20. The attachable/detachable RF coil 26 may include a plurality of RF coils including a head RF coil, a chest RF coil, a leg RF coil, a neck RF coil, a shoulder RF coil, a wrist RF coil, and an ankle RF coil for some parts of an object, depending on a diagnosis part of the object.

Moreover, the RF coil 26 may communicate with an external device in a wired/wireless manner, and perform dual tune communication based on a communication frequency band.

Moreover, the RF coil 26 may include a birdcage coil, a surface coil, and a TEM coil, depending on a shape and structure of a coil.

Moreover, the RF coil 26 may include a transmission dedicated coil, a reception dedicated coil, and a transmission/reception coil, depending on an RF signal transmission/reception method.

Moreover, the RF coil 26 may include RF coils of various channels such as 16 channels, 32 channels, 72 channels, and 144 channels.

Hereinafter, as an example, a case will be described in which the RF coil 26 is an RF multi-coil that includes N number of coils respectively corresponding to a plurality of channels, namely, first to Nth channels. Here, the RF multi coil may be referred to as a multichannel RF coil.

The gantry 20 may further include a display 29 disposed outside the gantry 20 and a display (not shown) disposed inside the gantry 20. A user may provide certain information to the object 10 by using the displays respectively disposed inside and outside the gantry 20.

The signal data acquirer 30 may control a gradient magnetic field which is generated inside (i.e., the bore) the gantry 20, and control transmission/reception of an RF signal and an MR signal, according to a certain MR sequence.

The signal data acquirer 30 may include a gradient amplifier 32, a transmission/reception switch 34, an RF transmission unit 36, i.e., RF transmitter, and an RF data acquisition unit 38, i.e., RF receiver.

The gradient amplifier 32 may drive the gradient coil 24 included in the gantry 20, and supply a pulse signal, used to generate a gradient magnetic field, to the gradient coil 24 according to control by a gradient magnetic field control unit 54, i.e., a gradient magnetic field controller. Gradient magnetic fields in the X-axis, Y-axis, and Z-axis directions may be synthesized by controlling the pulse signal supplied from the gradient amplifier 32 to the gradient coil 24.

The RF transmission unit 36 and the RF data acquisition unit 38 may drive the RF coil 26. The RF transmission unit 36 may supply an RF pulse having a Larmor frequency to the RF coil 26, and the RF data acquisition unit 38 may receive an MR signal received by the RF coil 26.

The transmission/reception switch 34 may adjust a transmission/reception direction of each of the RF and MR signals. For example, in a transmission mode, the transmission/reception switch 34 may pass the RF signal to be irradiated on the object 10 to the RF coil 26, and in a reception mode, the transmission/reception switch 34 may pass the MR signal received from the object 10 by means of the RF coil 26 to the RF data acquisition unit 38. The transmission/reception switch 34 may be controlled by a control signal from an RF control unit 56, i.e., an RF controller.

The monitor 40 may monitor or control the gantry 20 or elements included in the gantry 20. The monitor 40 may include a system monitoring unit 42, an object monitoring unit 44, a table control unit 46, i.e., a table controller, and a display control unit 48, i.e., a display controller.

The system monitoring unit 42 may monitor or control a state of a static magnetic field, a state of a gradient magnetic field, a state of an RF signal, a state of an RF coil, a state of a table, a state of an element that measures body information of an object, a power supply state, a state of a heat exchanger, a state of a compressor, etc.

The object monitoring unit 44 monitors a state of the object 10. Specifically, the object monitoring unit 44 may include a camera for observing a movement or position of the object 10, a breathing analyzer for analyzing the breathing by the object 10, an electrocardiogram (ECG) measurer for measuring an ECG of the object 10, or a body temperature measurer for measuring a body temperature of the object 10.

The table control unit 46 controls a movement of the table 28 having the object 10 located thereon. The table control unit 46 may control the movement of the table 28 according to sequence control by the system controller 50. For example, in capturing a moving image of an object, the table control unit 46 may continuously or intermittently move the table 28 according to the sequence control by the system controller 50, and thus photograph the object 10 at a view greater than a field of view (FOV) of the gantry 20.

The display control unit 48 controls the displays which are respectively disposed outside and inside the gantry 20. Specifically, the display control unit 48 may turn the displays disposed outside and inside the gantry 20 on or off, or control a screen displayed by each of the displays. Also, when a speaker is disposed inside or outside the gantry 20, the display control unit 48 may turn the speaker or sound outputted by the speaker on or off.

The system controller 50 may include a sequence control unit 52, i.e., a sequence controller, that controls a processing of a sequence of signals that are generated in the gantry 20 or that controls a sequence of signals to be generated in the gantry 20. The system controller 50 may further include a gantry control unit 58, i.e., a gantry controller, that controls the gantry 20 and elements mounted on the gantry 20.

The sequence control unit 52 may include the gradient magnetic field control unit 54 that controls the gradient amplifier 32, and the RF control unit 56 that controls the RF transmission unit 36, the RF data acquisition unit 38, and the transmission/reception switch 34. The sequence control unit 52 may control the gradient amplifier 32, the RF transmission unit 36, the RF data acquisition unit 38, and the transmission/reception switch 34 according to a pulse sequence received from the operating unit 60. Here, the pulse sequence includes all information necessary to control the gradient amplifier 32, the RF transmission unit 36, the RF data acquisition unit 38, and the transmission/reception switch 34, and for example, may include information on an intensity of a pulse signal applied to the gradient coil 24, an application time, and an application timing.

The operation unit 60 may provide pulse sequence information to the system controller 50, and simultaneously control an overall operation of the MRI apparatus.

The operating unit 60 may include an image processing unit 62, i.e., an image processor, that processes the MR signal received from the RF data acquisition unit 38, an output unit 64, and an input unit 66.

The image processing unit 62 may process the MR signal received from the RF data acquisition unit 38 to generate an MRI image that is MRI image data of the object 10.

The image processing unit 62 may perform various signal processing operations, such as amplification, frequency conversion, phase detection, low-frequency amplification, and filtering, on the MR signal received by the RF data acquisition unit 38.

The image processing unit 62, for example, may arrange digital data in a k-space, and perform a 2D or 3D Fourier transform on the digital data to reconfigure the digital data into image data.

Moreover, depending on the case, the image processing unit 62 may perform a synthesis processing or differential operation processing on the image data. The synthesis processing may include an addition processing and a maximum intensity projection (MIP) processing on a pixel. Also, the image processing unit 62 may store image data, on which the synthesis processing or differential operation processing has been performed, in addition to the reconfigured image data, in a memory (not shown) or an external server (not shown).

Moreover, the image processing unit 62 may parallelly perform various signal processings on the MR signal. For example, the image processing unit 62 may parallelly perform signal processing on a plurality of MR signals received by a multichannel RF coil to reconfigure the plurality of MR signals into image data.

The output unit 64 may output the image data generated or the image data reconfigured by the image processing unit 62 to a user. Also, the output unit 64 may output information (which is necessary for the user to manipulate the MRI apparatus) such as a user interface (UI), user information, or object information, in addition to the MRI image. The output unit 64 may include a speaker, a printer, a CRT display, an LCD, a PDP, an OLED display, an FED, an LED display, a VFD, a DLP display, a PFD, a 3D display, a transparent display, etc., and include various output devices within a scope obvious to those skilled in the art.

The user may input object information, parameter information, a scanning condition, a pulse sequence, information on image synthesis or differential operation, etc. by using the input unit 66. The input unit 66 may include a keyboard, a mouse, a trackball, a voice recognizer, a gesture recognizer, a touch pad, a touch screen, etc., and include various input devices within a scope obvious to those skilled in the art.

FIG. 1 illustrates the signal data acquirer 30, the monitor 40, the system controller 50, and the operating unit 60 as separate elements. However, those skilled in the art understand that respective functions performed by the signal data acquirer 30, the monitor 40, the system controller 50, and the operating unit 60 may be performed by different elements. For example, it has been described above that the image processing unit 62 converts the MR signal received by the RF data acquisition unit 38 into a digital signal, but the conversion from the MR signal to the digital signal may be performed directly by the RF data acquisition unit 38 or the RF coil 26.

The gantry 20, the signal data acquirer 30, the monitor 40, the system controller 50, and the operating unit 60 may be connected to each other in a wired/wireless manner. When they are connected in a wired manner, an element for synchronizing a clock therebetween may be further provided. Communication between the gantry 20, the signal data acquirer 30, the monitor 40, the system controller 50, and the operating unit 60 may use a high-speed digital interface, such as low-voltage differential signaling (LVDS), asynchronous serial communication such as a universal asynchronous receiver transmitter (UART), a low-delay network protocol such as synchronous serial communication or a can area network (CAN), or optical communication, and use various communication schemes within a scope obvious to those skilled in the art.

Figure 2:
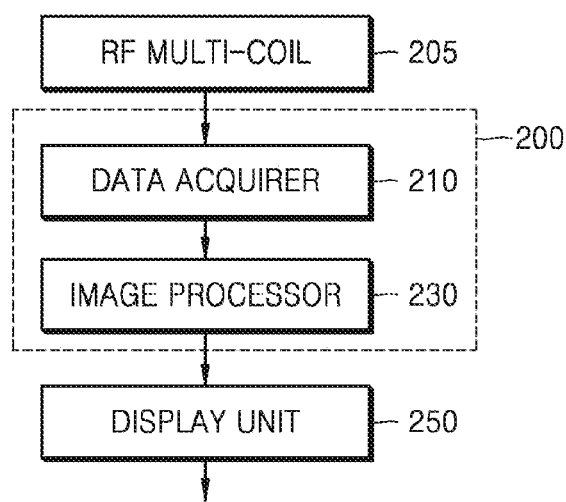
FIG. 2 is a diagram illustrating an MRI apparatus according to an embodiment of the present invention.

FIG. 2 is a diagram illustrating an MRI apparatus 200 according to an embodiment of the present invention.

Referring to FIG. 2, the MRI apparatus 200 according to an embodiment of the present invention includes a data acquirer 210 and an image processor 230. Also, the MRI apparatus 200 may be connected, by a wired/wireless manner, to an RF multi-coil 205 included in a gantry, and the data acquirer 210 may receive an MR signal sensed by the RF multi-coil 205. In FIG. 2, the RF multi-coil 205 corresponds to the RF coil 26 of FIG. 1. Also, the data acquirer 210 may be connected to the RF data acquisition unit 38 of FIG. 1, and may receive an MR signal from the RF data acquisition unit 38.

The MRI apparatus 200 is an apparatus that performs imaging on an MR image by using an MR signal acquired by a plurality of channel coils included in the RF multi-coil 205.

The RF multi-coil 205 includes the plurality of channel coils. In detail, the RF multi-coil 205 includes first to nth channel coils, and each of the n channel coils receives an MR signal that is an RF signal.

In detail, the RF multi-coil 205 applies an RF signal to an object to excite nuclear spins of the object. Then, the nuclear spins of the object are transit to a high energy state by the applied RF signal, and subsequently returns to the original energy state to emit the remaining energy to the outside. At this time, the energy emitted from the nuclear spins is an MR signal that is an RF signal, and the RF multi-coil 205 may sense the emitted MR signal to transmit the sensed MR signal to the data acquirer 210.

That is, the data acquirer 210 receives the MR signal acquired by the RF multi-coil 205 including the plurality of channel coils.

For example, the data acquirer 210 arranges MR signals, which are respectively received from the n channel coils included in the RF multi-coil 205, in a K-space to generate n pieces of raw data. In detail, the raw data may be a signal that is generated by arranging the MR signals, which are RF signals respectively received from the coils by channel included in the RF multi-coil 205, in the K-space, and may be under-sampled K-space data. Here, the K-space is a spatial frequency domain, and is formed by a Kx axis corresponding to frequency encoding and a Ky axis corresponding to phase encoding.

Moreover, the data acquirer 210 may transfer the MR signals, received from the RF multi-coil 205, to the image processor 230. In this case, the image processor 230 may arrange the MR signals, transferred from the data acquirer 210, in the K-space to generate the under-sampled K-space data. In detail, the data acquirer 210 may perform under-sampling on the MR signals respectively corresponding to the plurality of channel coils included in the RF multi-coil 205 to generate a plurality of pieces of under-sampled K-space data respectively corresponding to the plurality of channel coils.

For example, when the RF multi-coil 205 includes the n channel coils, the data acquirer 210 may receive n number of MR signal sets corresponding to n number of channel coils to generate n pieces of under-sampled K-space data.

The following description will be made on an operation in which the data acquirer 210 receives the MR signals from the RF multi-coil 205, and performs under-sampling on the MR signals to generate the under-sampled K-space data.

The data acquirer 210 performs under-sampling on the MR signals, respectively received from the plurality of channel coils, at non-uniform intervals to acquire the under-sampled K-space data respectively corresponding to the plurality of channel coils. Here, the under-sampled K-space data include a plurality of pieces of acquired line data. That is, the data acquirer 210 may perform under-sampling on the MR signals, respectively received from the plurality of channel coils, at non-uniform intervals to acquire a plurality of pieces of line data. Also, the under-sampled K-space data is image data which is incomplete for imaging MR images by channel.

The image processor 230 restores a plurality of pieces of K-space data respectively corresponding to the plurality of channel coils by using a relationship between the acquired plurality of pieces of line data. Also, the image processor 230 may generate a final MR image by using the restored plurality of pieces of K-space data.

Detailed operations of the data acquirer 210 and the image processor 230 will be described below in detail with reference to FIGS. 3 to 5.

Moreover, the MRI apparatus 200 may be connected to a display unit 250 by a wired/wireless manner. The display unit 250 may be included in the output unit 64 of FIG. 1, or may be provided separately. Also, the display unit 250 may be included in the MRI apparatus 200. The display unit 250 may display the final MR image generated by the image processor 230 in order for a user to visually recognize the final MR image.

Figure 3A:
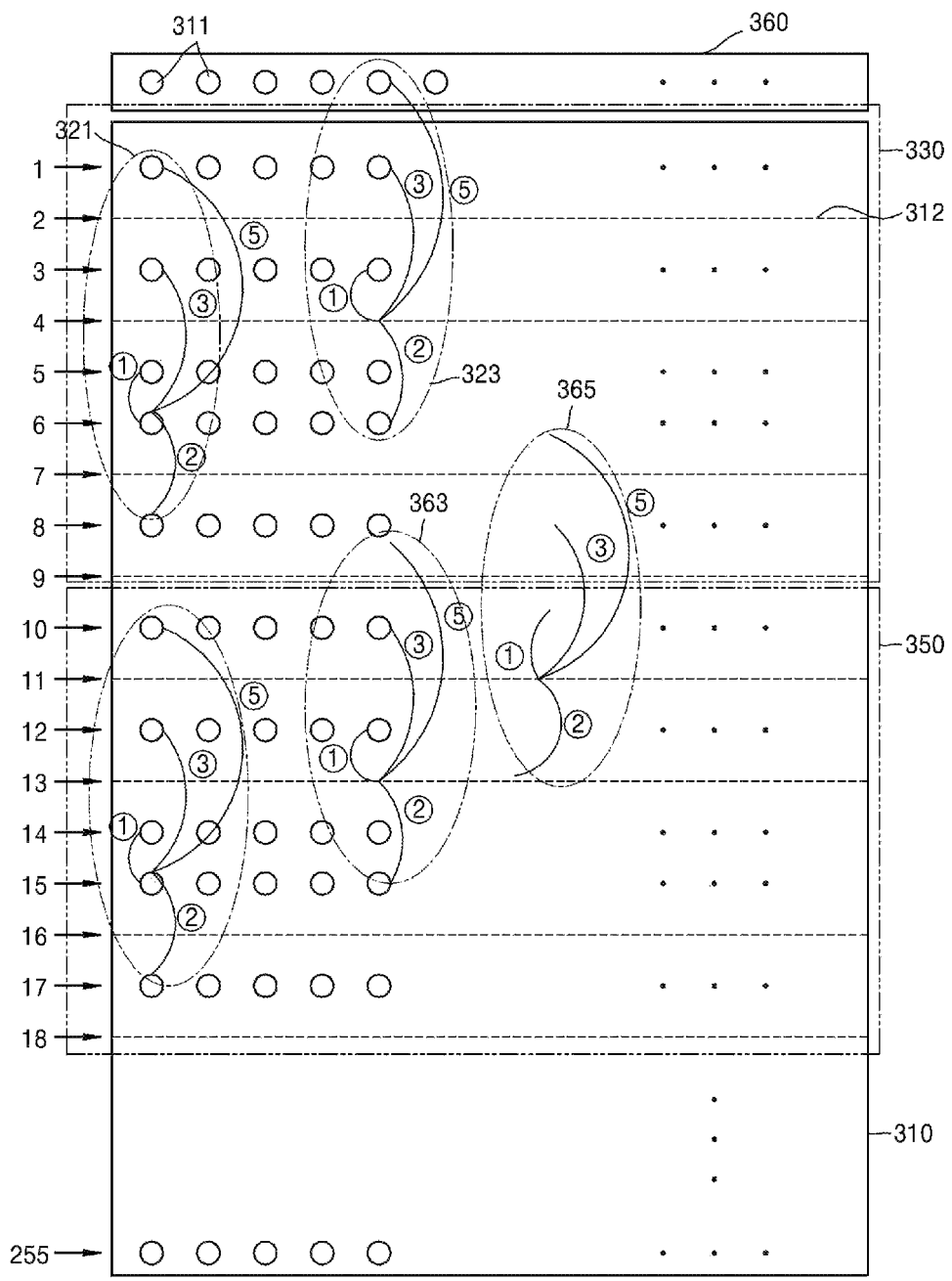
FIGS. 3A and 3B are diagrams for describing an operation of the MRI apparatus according to an embodiment of the present invention.
Figure 3B:
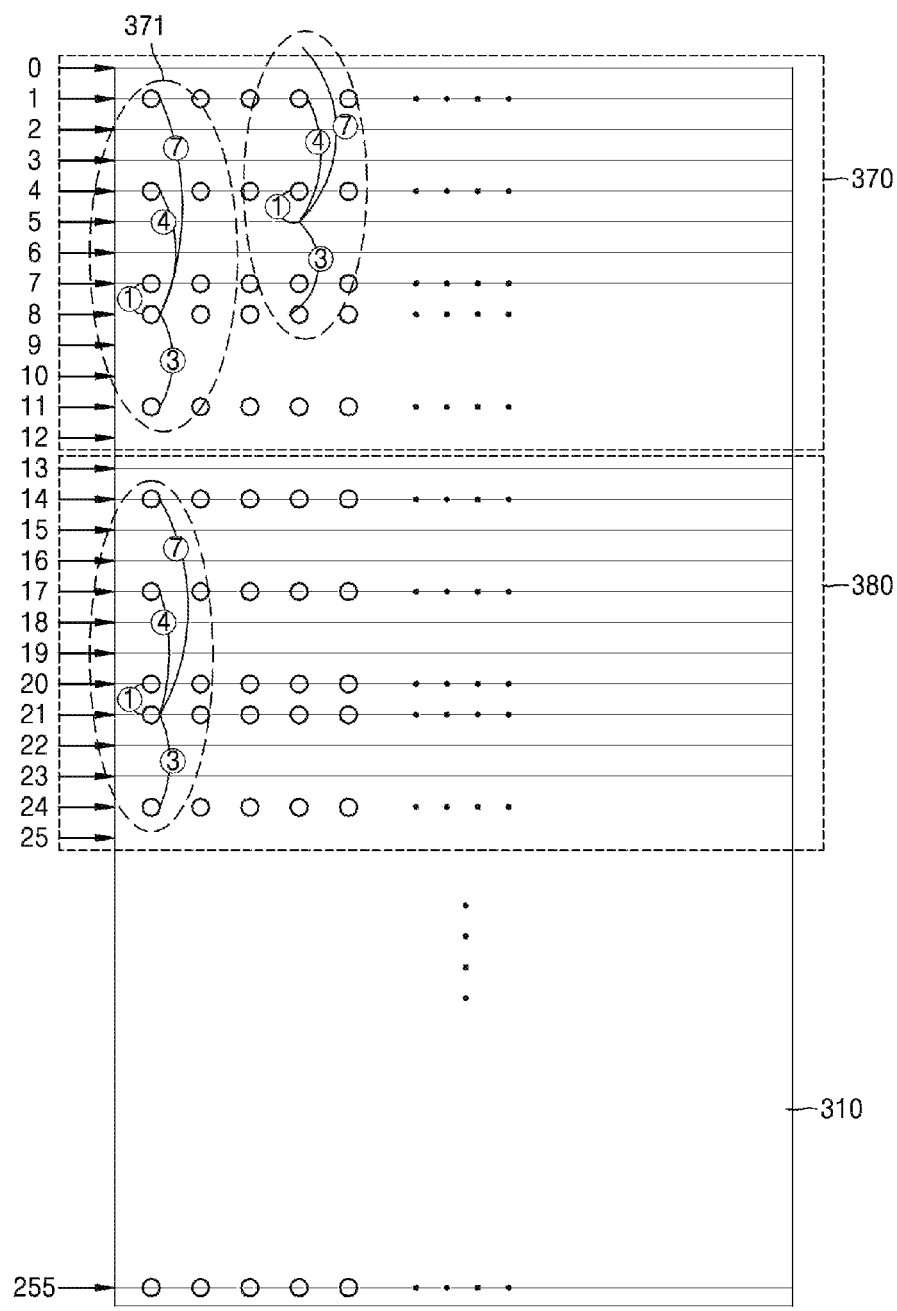

FIGS. 3A and 3B are diagrams for describing an operation of the MRI apparatus 200 according to an embodiment of the present invention.

The data acquirer 210 performs under-sampling on the MR signals, respectively received from the plurality of channel coils, at non-uniform intervals to generate the plurality of pieces of under-sampled K-space data respectively corresponding to the plurality of channel coils. In detail, the data acquirer 210 wholly performs under-sampling in a K-space corresponding to each of a plurality of channel coils to generate under-sampled K-space data. In detail, since the under-sampling is wholly performed in the K-space, sampling is performed in a high frequency domain as well as a low frequency domain which is a central region of the K-space. Therefore, since the under-sampling is wholly performed in the K-space, the MRI apparatus 200 has a merit in restoring an image in the low frequency domain and the high frequency domain which correspond to an entire region of the K-space.

In FIGS. 3A and 3B, under-sampled K-space data that is generated by performing sampling of an MR signal received from one channel coil is illustrated as an example.

In detail, FIG. 3A illustrates an example of under-sampled K-space data 310. FIG. 3B illustrates another example of under-sampled K-space data.

Referring to FIG. 3A, the data acquirer 210 performs under-sampling of a received MR signal at non-uniform intervals. That is, in under-sampling for acquiring line data less than the total number of data lines of K-space data, intervals of acquired line data by under-sampling are non-uniform. For example, in acquiring K-space data having a resolution of 256*256, the data acquirer 210 does not perform sampling on all 256 lines but performs sampling on only some pieces of line data. Here, in the K-space data having a resolution of 256*256, the number of lines may be 256 lines which are disposed in a Ky direction. Furthermore, the data acquirer 210 performs sampling at non-uniform intervals of acquired lines. In FIG. 3A, data acquired through sampling is illustrated as circles, and unsampled data is illustrated as dot lines.

In detail, in the K-space data 310, a line acquired through sampling may be determined based on at least one selected from the number "b" of a block included in one piece of K-space data 310 corresponding to one channel coil, a block size "N", and an acceleration factor (AF). Here, the block size denotes the number of data lines included in one block (for example, in a block 330) included in the K-space data 310.

The number of a block denotes an order of a block which is disposed in the K-space data 310. For example, in K-space data in which a size of a field of view (FOV) is 256*256, when the number of lines included in one block 330 is 9, the number of blocks included in the K-space data 310 is 29 (256/9=28.44). Also, in FIG. 3, in the K-space data 310, the number of a block in a first-disposed block 330 is 1 and the number of a block in a second-disposed block 350 is 2.

For example, a line acquired through sampling may be determined based on the following Equation (1).

First acquisition line index: 1+N*(b−1)

Second acquisition line index: 1+AF+N*(b−1)

Third acquisition line index: 1+AF*2+N*(b−1)

Fourth acquisition line index: 2+AF*2+N*(b−1)

Fifth acquisition line index: 2+AF*3+N*(b−1)   [Equation 1]

For example, a first block 330 included in the K-space data 310 will be described as an example. In this case, an AF value is 2, a block size "N" is 9, and the number "b" of a block is 1. Therefore, when an AF "2", a block size "9" and the number "1" of blocks are substituted into Equation (1), First acquisition line index: 1+9*(1−1)=1, Second acquisition line index: 1+2+9*(1−1)=3, Third acquisition line index: 1+2*2+9*(1−1)=5, Fourth acquisition line index: 2+2*2+9*(1−1)=6, Fifth acquisition line index: 2+2*3+9*(1−1)=8

Therefore, referring to FIG. 3A, when the K-space data has 256 lines with respect to a Ky axis, in the first block 330, the data acquirer 210 may acquire signal values of 1, 3, 5, 6, and 8 lines, and does not acquire signal values of 2, 4, 7, and 9 lines. In detail, in performing under-sampling by the data acquirer 210, a sampling interval of 1, 3, and 5 lines is a two-line interval, a sampling interval of 5 and 6 lines is a one-line interval, and a sampling interval of 6, 8, 10, 12, and 14 lines is a two-line interval. Therefore, under-sampling intervals are non-uniform.

Moreover, the data acquirer 210 may divide a K-space corresponding to one channel coil into a plurality of blocks, and perform under-sampling on the divided plurality of blocks at non-uniform intervals to acquire a plurality of pieces of line data.

Referring to FIG. 3, in acquiring K-space data corresponding to one channel coil, the data acquirer 210 may divide a K-space corresponding to one channel coil into a plurality of blocks, for example, first and second blocks 330 and 350, and may simultaneously perform sampling on the plurality of blocks, namely, the first and second blocks 330 and 350.

For example, as illustrated in FIG. 3, when one block includes nine lines, in acquiring K-space data including 256 lines, the data acquirer 210 may divide a K-space corresponding to the one channel coil into 29 blocks, and perform under-sampling for each of the blocks to acquire a plurality of pieces of line data. In detail, in acquiring K-space data including 256 lines, when a K-space is divided into 29 blocks, one block may include 9 pieces of line data, four (256−9*28=4) pieces of line data may remain in a 29th block which is a last block, and the data acquirer 210 may perform sampling on all of the remaining four pieces of line data.

Moreover, a plurality of divided blocks may have a non-uniform under-sampling pattern which is the same under-sampling interval pattern. And, the same under-sampling interval pattern is non-uniform interval pattern. In FIG. 3A, a case in which a plurality of blocks have the same pattern is illustrated as an example. In detail, since the first block 330 and the second block 350 have the same sampling interval pattern, pieces of data are respectively acquired from first, third, fifth, sixth, and eighth lines of each of the first and second blocks 330 and 350, and pieces of data are not acquired from second, fourth, seventh, and ninth lines of each of the first and second blocks 330 and 350. In FIG. 3A, a line from which data is not acquired is illustrated as a dashed line.

Moreover, the data acquirer 210 performs under-sampling at non-uniform intervals in a whole K-space corresponding to each of a plurality of channel coils included in the RF multi-coil 205. That is, the data acquirer 210 wholly performs under-sampling to acquire pieces of line data.

Moreover, the same non-uniform under-sampling pattern may be applied to a plurality of blocks included in the K-space data 310, or different non-uniform under-sampling patterns may be respectively applied to the blocks included in the K-space data 310. Also, different non-uniform under-sampling patterns may be respectively applied to at least one block included in the blocks included in the K-space data 310.

The image processor 230 may restore a plurality of pieces of unacquired line data by using a relationship between a plurality of pieces of acquired line data, and restore K-space data corresponding to a certain channel coil by using at least one of the restored plurality of pieces of line data and the plurality of pieces of acquired line data.

In an example illustrated in FIG. 3A, the image processor 230 may acquire data from the first, third, fifth, sixth, and eighth lines of each of the first and second blocks 330 and 350, and restore a plurality of pieces of unacquired line data by using a relationship based on a spatial distance between the acquired plurality of pieces of line data. In detail, the image processor 230 may restore a plurality of pieces of unacquired line data by using a relationship based on a spatial distance between at least two of the acquired plurality of pieces of line data.

In detail, the image processor 230 may set one of the acquired plurality of pieces of line data to reference line data, and when spatial distances between the reference line data and at least two of the acquired plurality of pieces of line data have a first relationship, the image processor 230 may restore the plurality of pieces of unacquired line data by using the first relationship.

Referring to FIG. 3A, the image processor 230 may set sixth line data in the acquired plurality of pieces of line data in the first block 330, as the reference line data. Referring to a portion 321 of FIG. 3, spatial distances between the sixth line data (which is the reference line data) and first, third, fifth, and eighth line data (which are the other acquired line data) have a five-line interval, a three-line interval, a one-line interval, and a two-line interval, respectively. The image processor 230 may define a relationship between the reference line data and the acquired plurality of pieces of line data as an interval relationship "5, 3, 1, and 2". Here, one of the acquired plurality of pieces of line data may be set to the reference line data.

Moreover, the number and sizes of blocks included in one piece of K-space data (for example, 310 of FIG. 3A) may be changed based on at least one selected from a hardware type of the RF multi-coil 205 and a part of an object to be photographed. In detail, a size and a type of the RF multi-coil 205 may correspond to the hardware type of the RF multi-coil 205. Also, the part of the object to be photographed may be classified based on body parts such as a head, a neck, a stomach, a back, and an ankle. For example, the RF multi-coil 205 used to photograph a head may have a dome shape. As another example, the RF multi-coil 205 used to photograph a stomach or a leg may have a cylindrical shape. As another example, the RF multi-coil 205 used to photograph a back may have a plate shape.

In detail, the number and sizes of blocks included in the K-space data 310 may be changed based on a body part such as a head, a neck, a stomach, a back, or an ankle photographed by the RF multi-coil 205 or a shape of the RF multi-coil 205 such as a dome shape, a cylindrical shape, or a plate shape. Also, the number of blocks and a size of each block included in the K-space data 310 may be set to values which are experimentally optimized.

Moreover, a shape of a non-uniform under-sampling pattern in a block included in the one piece of K-space data 310 may be changed based on at least one selected from a hardware type of the RF multi-coil 205 and a part of an object to be photographed. In detail, the shape of the non-uniform under-sampling pattern may be changed based on a body part such as a head, a neck, a stomach, a back, or an ankle photographed by the RF multi-coil 205 or a shape of the RF multi-coil 205 such as a dome shape, a cylindrical shape, or a plate shape. Also, the shape of the non-uniform under-sampling pattern may be set to a value which is experimentally optimized.

Moreover, the number and sizes of blocks included in one piece of K-space data (for example, 310 of FIG. 3A) may be set by a user. Also, a shape of a non-uniform under-sampling pattern in a block included in the one piece of K-space data 310 may be set by the user.

Moreover, the image processor 230 may calculate a spatial correlation coefficient corresponding to the first relationship by using the reference line data and at least two of the acquired plurality of pieces of line data. Furthermore, the image processor 230 may restore the plurality of pieces of unacquired line data by using the spatial correlation coefficient.

Calculating the spatial correlation coefficient and restoring the unacquired line data will now be described in detail with reference to FIG. 4A.

FIG. 4A is a diagram for describing an operation of the MRI apparatus according to an embodiment of the present invention. FIG. 4A (a) is a diagram for describing calculation of a spatial correlation coefficient. FIG. 4A (b) is a diagram for describing estimation of unacquired line data.

Referring to FIG. 4A (a), in a matrix operation, a left term 410 is composed of signal values included in a plurality of pieces of acquired line data, and a right term 420 is composed of signal values included in reference line data. Kc denotes a spatial correlation coefficient.

In detail, the spatial correlation coefficient is a spatial interaction value between signal values measured adjacent to a certain value. A target signal value to estimate may be calculated by performing the matrix operation on adjacent signals and the spatial correlation coefficient.

Referring to FIG. 4A (a), the left term 410 is composed of signal values included in the first line data, third line data, fifth line data, and eighth line data that are signal values measured from the first block 330, and the right term 420 is composed of signal values included in the sixth line data (the reference line data) included in the first block 330. Therefore, since the left term 410 and the right term 420 include signal values of a plurality of pieces of acquired line data, the spatial correlation coefficient Kc may be acquired through an inverse matrix operation illustrated in FIG. 4A (a).

In detail, in order to acquire the spatial correlation coefficient Kc, as described above, the data acquirer 210 acquires K-space data (for example, 310 of FIG. 3A) by coil according to a non-uniform under-sampling pattern. An inverse operation of an arithmetic operation illustrated in FIG. 4A (a) is performed by using acquired line data. Therefore, the spatial correlation coefficient Kc is acquired by performing the inverse operation.

The image processor 230 may acquire unacquired line data by using the spatial correlation coefficient Kc. In detail, when the spatial correlation coefficient Kc is acquired, the image processor 230 may perform a matrix multiplication operation on the spatial correlation coefficient Kc and signal values of line data having the first relationship with unacquired line data to estimate the unacquired line data. An operation of restoring the unacquired line data by using the spatial correlation coefficient Kc may be performed for each block as described above with reference to FIGS. 3A and 3B.

Referring to FIG. 4A (b), in a matrix operation, a left term 430 is composed of signal values included in a plurality of pieces of line data having the first relationship with unacquired line data, and a right term 440 is composed of signal values included in the unacquired line data to estimate. Kc denotes a spatial correlation coefficient. Here, Kc may be referred to as a weighting matrix "W".

Moreover, Kc and the inverse matrix operation described above with reference to FIG. 4A (a) and (b) may be acquired or performed by various methods. In detail, Kc and the inverse matrix operation are disclosed in the paper "Introduction to inverse problems in imaging" presented by Mario Bertero & Patrizia Boccacci and the paper "Inverse problems theory and methods for model parameter estimation" presented by Albert Tarantola, and thus, their detailed descriptions are not provided.

Hereinafter, the weighting matrix "W" will be described in detail with reference to FIG. 4B.

As described above, when Kc is referred to as the weighting matrix "W", the weighting matrix "W" is determined by a block group "g", a coil number "j", an acceleration factor "r", the number of coils "Nc", and etc.

Referring to FIG. 4B (a), an equation for calculating the spatial correlation coefficient Kc described above with reference to FIG. 4A (a) is illustrated. In detail, the equation illustrated in FIG. 4B (a) is an example of an equation which is usable for calculating the spatial correlation coefficient Kc.

Referring to an equation illustrated in FIG. 4B (a), a left term 450, a right term 470, and a weighting matrix 460 respectively correspond to a right term 420 of a matrix operation illustrated in FIG. 4A (a), a left term 410 of the matrix operation, and the spatial correlation coefficient Kc.

FIG. 4B (b) is a diagram for describing factors which are used in the equation illustrated in FIG. 4B (a).

Referring to FIG. 4B (b), g denotes a block group. When K-space data (for example, 310 of FIG. 3A) corresponding to one channel coil is divided into a plurality of blocks, a block (for example, 330) may be a block group. When the K-space data 310 has a 256*256 size and one block is nine lines as illustrated in FIG. 3A, the number of blocks is 29, and thus, g may have a value of 1 to 29. j denotes a coil number, and when the RF multi-coil 205 includes a plurality of coils, j denotes a number of a coil included in the RF multi-coil 205. B denotes a block size. In detail, in FIG. 3A a block size may have a value "9". n denotes a block number in a group, and denotes a block number of a certain block included in the one piece of K-space data 310 corresponding to one coil. In detail, a block number of a block 330 which is first arranged in the K-space data 310 may be 1, and a block number of a second-arranged block 350 may be 2. Nc denotes the number of coils included in the RF multi-coil 205. Nb denotes the number of blocks adjacent to a current block. In detail, the number of blocks which are disposed adjacent to a current block (for example, 350) in the K-space data 310 may be 28 which is the number of blocks other than the current block 350 in the K-space data. $N_r$ denotes the number of data which are disposed at the right of a selected point in frequency encoding data which is disposed in a Kx direction in a K-space, and $N_l$ denotes the number of data which are disposed at the left of the selected point. r denotes an acceleration factor. M(b,r) denotes a non-uniform under-sampling pattern in which an acceleration factor in a b block has an r value.

In detail, Sg,j denotes a signal value at one selected point in a certain block in K-space data (for example, 310 of FIG. 3A), and Sg,c denotes signal values which are acquired from the other point in the certain block. Wg,j,r denotes a weighting matrix applied to a block and denotes the above-described spatial correlation coefficient Kc.

FIG. 4B (c) is a diagram illustrating a weighting matrix.

A weighting matrix 490 may be acquired by performing an inverse operation of the equation described above with reference to FIG. 4B (a). In detail, the weighting matrix 460 which is calculated by performing the inverse operation of the equation described above with reference to FIG. 4B (a) is the weighting matrix 490 described above with reference to FIG. 4B (c).

Referring to a portion 323 of FIG. 3A, when the spatial correlation coefficient Kc is acquired, the image processor 230 may substitute signal values (which are included in 255 line data 360, first line data, third line data, and sixth line data that are a plurality of pieces of line data having the first relationship (i.e., the interval relationship "5, 3, 1, and 2" with respect to the unacquired line data of a fourth line to estimate) with the unacquired line data of the fourth line) into the left term 430 of the matrix operation, and multiply the left term 430 and the spatial correlation coefficient Kc to calculate values of the right term 440 which are signal values of the unacquired line data of the fourth line. The image processor 230 may restore the unacquired line data to the calculated values of the right term 440. Here, a multiplication operation may be a multiplication operation between matrices described above with reference to FIG. 4A.

Unacquired line data may be restored for each block.

In detail, data may be simultaneously restored for a plurality of blocks. For example, the image processor 230 may calculate a spatial correlation coefficient applied to an operation of restoring data of the first block 330, and calculate a spatial correlation coefficient applied to an operation of restoring data of the second block 350. Furthermore, while unacquired line data of a fourth line of the first block 330 is being restored, unacquired line data of a thirteenth line that is a fourth line of the second block 350 may be restored.

Moreover, data may be separately restored for each of the plurality of blocks. For example, the image processor 230 may calculate the spatial correlation coefficient, applied to the operation of restoring data of the first block 330, to restore the data of the first block 330, and then may calculate the spatial correlation coefficient, applied to the operation of restoring data of the second block 350, to restore the data of the second block 350.

Moreover, the image processor 230 may estimate a plurality of pieces of unacquired line data by using the restored line data as acquired line data.

To describe the operation of restoring data of the second block 350 as an example, when unacquired line data of the thirteenth line is restored by using a plurality of pieces of acquired line data as in a portion 363, the image processor 230 may restore 11-line data that is second line data of the second block 350, by using 6-line data, 8-line data, and 10-line data that are the plurality of pieces of acquired line data and the restored 13-line data.

That is, referring to a portion 365, 11-line data may be restored by using 6-line data, 8-line data, 10-line data, and 13-line data that are a plurality of pieces of line data having the first relationship with the 11-line data to restore.

In detail, the image processor 230 may substitute signal values which are included in the 6-line data, 8-line data, 10-line data, and 13-line data illustrated in the portion 365 into the left term 430, and multiply the left term 430 and the spatial correlation coefficient Kc to calculate signal values included in the 11-line data. Also, the image processor 230 may restore the 11-line data by using the calculated signal values. Furthermore, the restored 11-line data may be subsequently used to restore 18-line data.

Moreover, the image processor 230 may sequentially restore a plurality of pieces of unacquired line data, included in each block, in a predetermined order. In detail, the image processor 230 starts to first restore unacquired line data which includes all signal values of a plurality of pieces of line data with the first relationship with the unacquired line data to restore.

In an example illustrated in FIG. 3A, restoration for a first block may be performed in the order of 4-line data, 2-line data, 9-line data, and 7-line data.

In the example illustrated in FIG. 3A, when K-space data corresponding to one channel coil includes 256 lines and one block includes nine pieces of line data, in parallelly restoring unacquired line data by block, the image processor 230 may calculate a spatial correlation coefficient which is used to restore the unacquired line data of each block, and then restore the unacquired line data in the following order:

First-restored unacquired line data: 4, 13, 22, 31, . . . , and 256

Second-restored unacquired line data: 2, 11, 20, 29, . . . , and 254

Third-restored unacquired line data: 9, 18, 27, 36, . . . , and 252

Third-restored unacquired line data: 7, 16, 25, 34, . . . , and 250

In detail, referring to FIG. 3A, in a first block 330, unacquired line data may be restored in the order of 4, 2, 9, and 7 lines.

The image processor 230, as described above, may estimate all unacquired line data by using a relationship between pieces of line data which are acquired through sampling performed at non-uniform intervals. Therefore, the image processor 230 may acquire restored pieces of K-space data which are full-sampled K-space data by channel coil.

Moreover, as described above, lines acquired from one block may be determined based on at least one selected from the number "b" of a block included in the K-space data 310, a block size "b", and an AF. Therefore, acquired line data or a non-uniform sampling pattern may be adjusted by adjusting at least one selected from the number "b" of a block included in the K-space data 310, the block size "b", and the AF.

As another example, it is assumed that an AF value is 3, a block size "N" is 13, and the number "b" of a block is 1. Therefore, when an AF "3", a block size "13" and the number "1" of blocks are substituted into Equation (1), First acquisition line index: 1+13*(1−1)=1, Second acquisition line index: 1+3+13*(1−1)=4, Third acquisition line index: 1+3*2+13*(1−1)=7, Fourth acquisition line index: 2+3*2+13*(1−1)=8, Fifth acquisition line index: 2+3*3+13*(1−1)=11

Therefore, referring to FIG. 3B, when K-space data has 256 lines on a Ky axis, in a first block 370, signal values of 1, 4, 7, 8, and 11 lines are acquired, and signal values of 2, 3, 5, 6, 9, and 11 lines are not acquired. In detail, in performing under-sampling by the data acquirer 210, a sampling interval of 1, 4, and 7 lines is a 3-line interval, a sampling interval of 7 and 8 lines is a 1-line interval, and a sampling interval of 11, 14, 17, and 20 lines is a 3-line interval, whereby an under-sampling interval is non-uniform.

In detail, referring to FIG. 3B, since the first block 370 and a second block 380 have the same sampling interval pattern, data is acquired in first, fourth, seventh, eighth, and eleventh lines in a block, and data is not acquired in second, third, fifth, sixth, ninth, and tenth lines in the block. In FIG. 3B, a line in which data is not acquired is illustrated as a dot line.

Referring to FIG. 3B, in the same method as that of FIG. 3A, the image processor 230 may set, as reference line data, eighth line data among pieces of line data which are acquired in the first block 370. Referring to a portion 371 of FIG. 3B, spatial distances between the eighth line data (which is the reference line data) and first, fourth, seventh, and eleventh line data (which are other acquired pieces of line data) have a 7-line interval, a 4-line interval, a 1-line interval, and a 3-line interval. The image processor 230 may define a relationship between the reference line data and the acquired pieces of line data as an interval relationship (7, 4, 1, 3). Here, one of the acquired pieces of line data may be set as the reference line data.

Moreover, in the same method as that of FIG. 3A, the image processor 230 may restore unacquired line data.

FIG. 5 is another diagram for describing an operation of the MRI apparatus according to an embodiment of the present invention.

Referring to FIG. 5, when the RF multi-coil 205 includes n number of channel coils COIL1 to COILN, the image processor 230 may restore unacquired line data from n pieces of under-sampled K-space data 510 through 520 respectively corresponding to the n channel coils COIL1 through COILN. Therefore, the image processor 230 may acquire n pieces of restored K-space data 515 through 525 respectively corresponding to the n channel coils COIL1 through COILN.

Moreover, the image processor 230 may perform a spatial transform on the plurality of pieces of restored K-space data 515 through 525 respectively corresponding to the plurality of channel coils COIL1 through COILN to generate a plurality of MR images 517 through 527 by channel, and acquire a final MR image 550 by using the plurality of MR images 517 through 527 by channel.

In detail, the image processor 230 may perform an inverse Fourier transform (IFT) or an inverse fast Fourier transform (IFFT) on the restored K-space data 515 through 525, for transforming the restored K-space data 515 and 525 from a frequency domain into a spatial domain. The image processor 230 may calculate a sum of squares or complex sum of n number of inverse fast Fourier-transformed MR images 517 through 527 to acquire the final MR image 550.

Moreover, the image processor 230 may divide a plurality of blocks into a certain number of groups, and set different non-uniform under-sampling interval patterns for the divided groups.

Moreover, the image processor 230 may cause a plurality of blocks, into which a K-space corresponding to one channel coil is divided, to have different non-uniform under-sampling interval patterns.

For example, the image processor 230 may divide K-space data into a plurality of blocks, distinguish at least one first block and at least one second block, and set different under-sampling interval patterns in order for the first and second blocks to have the different under-sampling interval patterns. In detail, the first block may be set to have an under-sampling interval pattern that causes the first block to include acquired line data more than or less than those of the second block.

As a detailed example, when the K-space is divided into 29 blocks in order for one block to include nine lines, as in the example illustrated in FIG. 3A, the image processor 230 may more densely set under-sampling interval patterns of fourteenth and fifteenth blocks, disposed at a center portion of the K-space, than those of the other blocks.

As another example, the image processor 230 may divide the K-space into a plurality of blocks, distinguish at least one first block, at least one second block, and at least one third block, and set different under-sampling interval patterns in order for the first to third blocks to have the different under-sampling interval patterns. As a detailed example, the second block may be set to have an under-sampling interval pattern that causes the second block to include acquired line data less than those of the first block, and the third block may be set to have an under-sampling interval pattern that causes the third block to include acquired line data more than those of the first block. In this case, the third block may be a block that is disposed more adjacent to a center line of the K-space than the first or second block. And, the second block may be a block that is disposed at an edge portion of the K-space as compared to the first block.

For example, when the K-space is divided into twenty-eight blocks in order for one block to include nine lines, as in the example illustrated in FIG. 3A, the image processor 230 may more densely set under-sampling interval patterns of the fourteenth and fifteenth blocks, disposed at the center portion of the K-space, than those of third to thirteenth blocks and sixteenth to twenty-sixth blocks that are the other blocks. Furthermore, the image processor 230 may less densely set under-sampling interval patterns of first and second blocks and twenty-seventh and twenty-eighth blocks, disposed at an edge portion of the K-space, than those of the third to thirteenth blocks and the sixteenth to twenty-sixth blocks that are the other blocks.

Moreover, the image processor 230 may divide the K-space into a plurality of blocks, and may more densely set an under-sampling interval pattern of a block which is closer to the center line of the K-space. For example, when the K-space includes 256 pieces of line data, the center line is a 128th line. In this case, the image processor 230 may more densely set an under-sampling interval pattern of a block adjacent to the 128th line than those of the other blocks.

A center portion of the K-space is a low-frequency domain. When the number of sampled line data increases by densely setting an under-sampling interval pattern of a block included in the low-frequency domain of the K-space, a clear MR image is acquired, thus improving a quality of a final MR image.

Moreover, a peripheral portion of the K-space is a high-frequency domain. When the number of sampled line data decreases by less densely setting an under-sampling interval pattern of a block included in the high-frequency domain of the K-space, an acquisition time of an MR image is shortened without a large degradation in a quality of the MR image.

As described above, the data acquirer 210 under-samples MR signals, which are respectively received from the plurality of channel coils included in the RF multi-coil 205, at non-uniform intervals in a whole K-space to acquire pieces of line data. In detail, referring to FIG. 3, the pieces of line data are acquired according to a non-uniform under-sampling pattern in the K-space data 310.

The image processor 230 restores complete K-space data corresponding to each of the plurality of channel coils by using a relationship between the pieces of line data which are acquired by performing under-sampling at non-uniform intervals. In detail, referring to FIGS. 3 to 5, the image processor 230 may acquire the spatial correlation coefficient Kc by using a relationship, based on a spatial distance between the acquired pieces of line data, between the acquired pieces of line data, and restore complete K-space data (for example, 515 and 525) corresponding to each channel coil by using the acquired spatial correlation coefficient Kc.

FIG. 6 is a flowchart of an MR imaging method 600 according to an embodiment of the present invention. The method 600 of imaging an MR image according to an embodiment of the present invention can be performed by the MRI apparatus 200 according to an embodiment of the present invention described above with reference to FIGS. 1 to 5, and thus, the same descriptions provided with regard to FIG. 1 are not repeated.

Referring to FIG. 6, in operation 610, the method 600 of imaging an MR image according to an embodiment of the present invention performs under-sampling on MR signals, respectively received from the plurality of channel coils included in the RF multi-coil 205, at non-uniform intervals to acquire a plurality of pieces of line data. Operation 610 may be performed by the data acquirer 210.

In operation 620, the method 600 restores a plurality of pieces of K-space data respectively corresponding to the plurality of channel coils by using a relationship between the plurality of pieces of line data which are acquired in operation 610. Operation 620 may be performed by the image processor 230 of the MRI apparatus 200.

Moreover, an MR image imaging method 600 may be performed as follows.

In detail, in operation 610, the data acquirer 210 under-samples MR signals, which are respectively received from the plurality of channel coils included in the RF multi-coil 205, at non-uniform intervals in a whole K-space to acquire pieces of line data. In detail, referring to FIG. 3, the pieces of line data are acquired according to a non-uniform under-sampling pattern in the K-space data 310.

Moreover, in operation 620, the image processor 230 restores complete K-space data corresponding to each of the plurality of channel coils by using a relationship between the pieces of line data which are acquired by performing under-sampling at non-uniform intervals. In detail, referring to FIGS. 3 to 5, the image processor 230 may acquire the spatial correlation coefficient Kc by using a relationship, based on a spatial distance between the acquired pieces of line data, between the acquired pieces of line data, and restore complete K-space data (for example, 515 and 525) corresponding to each channel coil by using the acquired spatial correlation coefficient Kc.

FIG. 7 is a flowchart of an MR imaging method 700 according to another embodiment of the present invention. The method 700 of imaging an MR image according to another embodiment of the present can be performed by the MRI apparatus 200 according to an embodiment of the present invention described above with reference to FIGS. 1 to 5. Also, operations 710 and 720 of FIG. 7 respectively correspond to operations 610 and 620 of FIG. 6. Thus, the same descriptions provided with regard to FIG. 1 are not repeated.

Referring to FIG. 7, the method 700 divides a K-space, corresponding to each of the plurality of channel coils included in the RF multi-coil 205, into a plurality of blocks, and performs under-sampling on MR signals, respectively received from the plurality of blocks which each include a plurality of channel coils, at non-uniform intervals to acquire a plurality of pieces of line data in operation 710. Operation 710 may be performed by the data acquirer 210.

Here, as illustrated in FIG. 3A, the plurality of blocks may have the same under-sampling interval pattern which is non-uniform. Also, the plurality of blocks may be divided into a certain number of groups, which may be set to have different under-sampling interval patterns. Also, the plurality of blocks may have different under-sampling interval patterns.

In operation 720, the method 700 restores a plurality of pieces of K-space data respectively corresponding to the plurality of channel coils by using a relationship between the plurality of pieces of line data which are acquired in operation 710. Operation 720 may be performed by the image processor 230.

In detail, the method 700 may restore a plurality of pieces of unacquired line data by using the relationship between the plurality of pieces of line data which are acquired in operation 710, and restore K-space data corresponding to a channel coil by using at least one of the restored plurality of pieces of line data and the acquired plurality of pieces of line data.

In detail, in operation 720, the method 700 sets one of the plurality of pieces of line data (which are acquired in operation 710) to reference line data. When spatial distances between the reference line data and at least two of the acquired plurality of pieces of line data have a first relationship, the method 700 may restore the plurality of pieces of unacquired line data by using the first relationship.

In operation 720, restoring the unacquired line data has been described above in detail with reference to FIGS. 3A and 4A, and thus, the same descriptions provided with regard to FIGS. 3A and 4A are not repeated.

In operation 730, the method 700 restores K-space data corresponding to a channel coil by using at least one of the plurality of pieces of unacquired line data (which are restored in operation 720) and the plurality of pieces of line data which are acquired in operation 710. Operation 730 may be performed by the image processor 230.

Subsequently, in operation 740, the method 700 performs a spatial transform on the restored plurality of pieces of K-space data respectively corresponding to a plurality of channel coils to generate a plurality of MR images by channel. Operation 740 may be performed by the image processor 230. In detail, the method 700 may perform an inverse Fourier transform on the plurality of pieces of K-space data respectively corresponding to the plurality of channel coils to generate the plurality of MR images by channel.

In operation 750, the method 700 acquires a final MR image by using the plurality of MR images by channel which are acquired in operation 740. Operation 740 may be performed by the image processor 230. In detail, the method 700 may calculate a sum of squares or complex sum of the plurality of MR images by channel to generate the final MR image.

Figure 8:
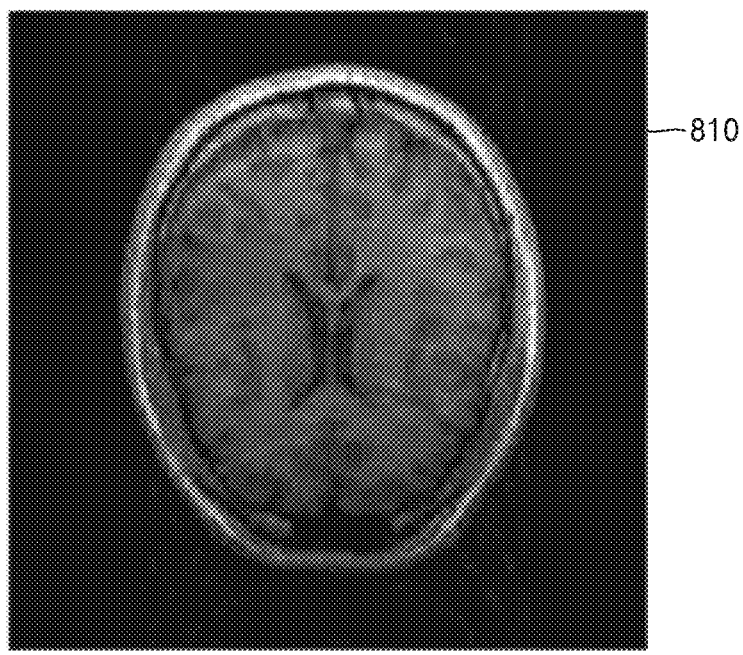
FIG. 8 are images for describing an MR image generated by the MRI apparatus and the MR imaging method according to an embodiment or another embodiment of the present invention.

FIG. 8 is a diagram for describing an MR image generated by the MRI apparatus and the MR imaging method according to an embodiment or another embodiment of the present invention.

Referring to FIG. 8, aliasing artifacts are dispersed and shown in the final MR image 810 generated from K-space data for which under-sampling has been performed at non-uniform intervals.

Figure 9:
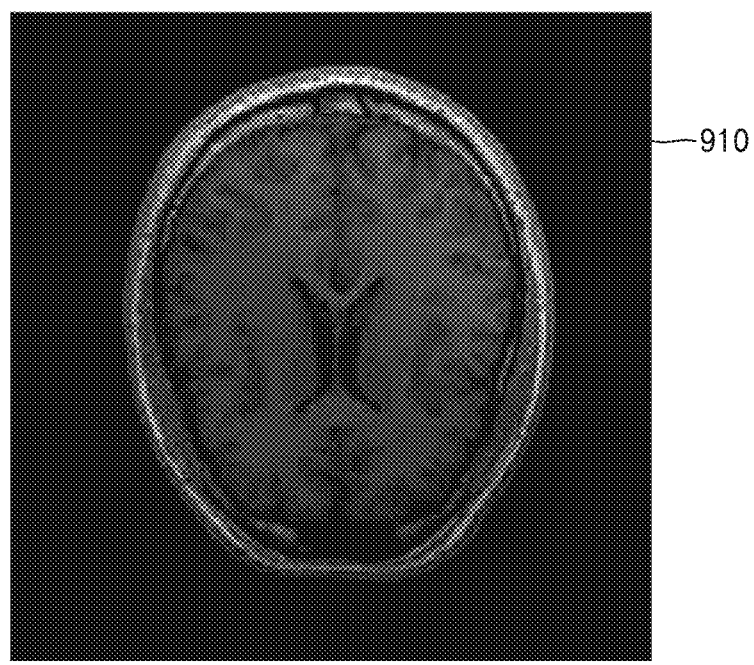
FIG. 9 are images for describing an MR image generated by the MRI apparatus and the MR imaging method according to an embodiment or another embodiment of the present invention.

FIG. 9 is a diagram for describing an MR image generated by the MRI apparatus and the MR imaging method according to an embodiment or another embodiment of the present invention.

In detail, FIG. 9 is an image obtained by performing image enhancement processing of a final MR image acquired by the MRI apparatus and the MR imaging method according to an embodiment or another embodiment of the present invention.

The MRI apparatus may restore under-sampled K-space data to generate restored K-space data, and generate a final MR image by using the restored K-space data. Subsequently, the MRI apparatus may perform image enhancement processing including noise reduction processing, edge enhancement processing, and contrast enhancement processing, for improving a quality of the final MR image.

When aliasing artifacts are dispersed and shown in an MR image, the aliasing artifacts are removed from the MR image through subsequent image enhancement processing, thus minimizing aliasing artifacts.

Figure 10:
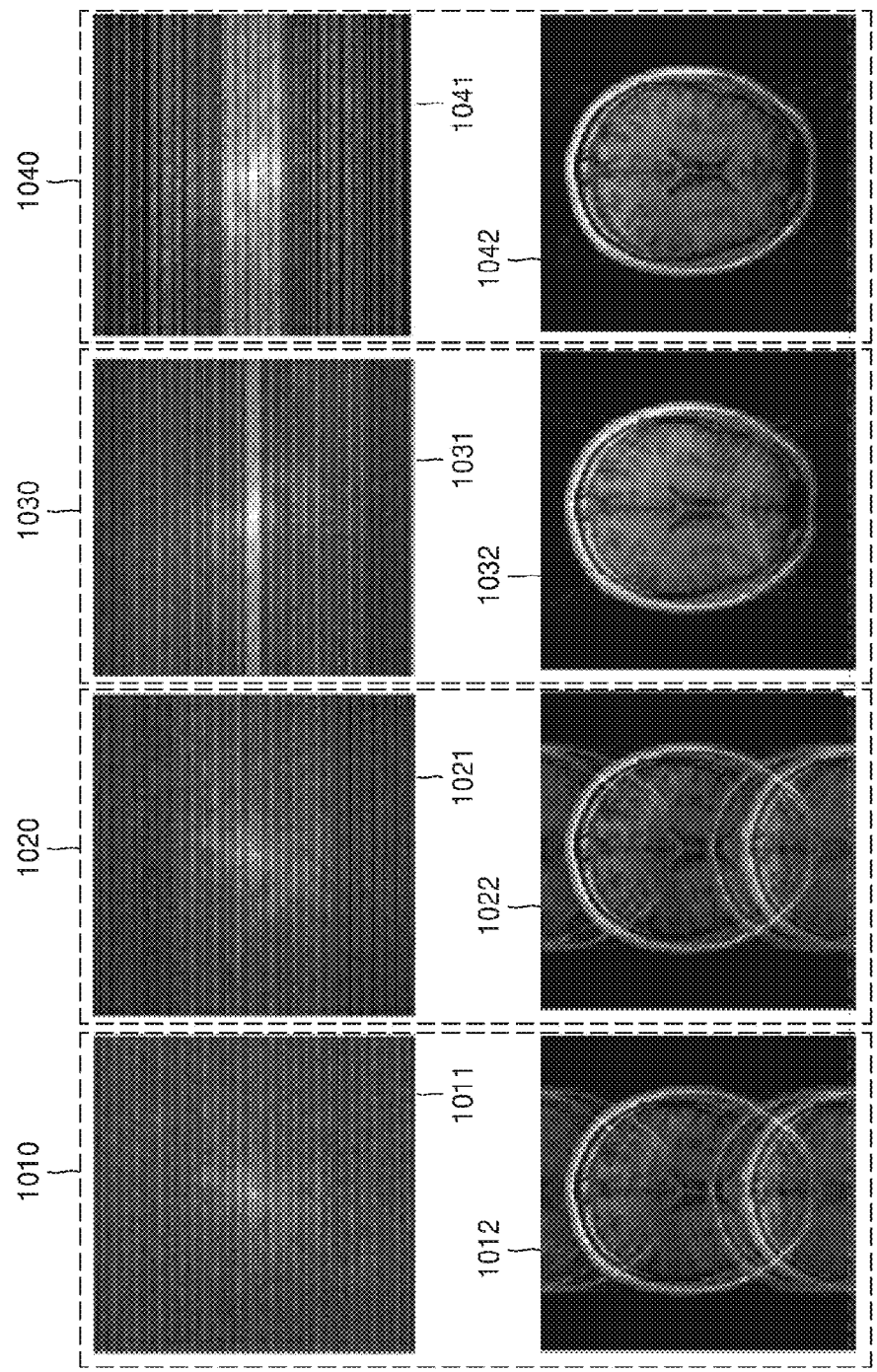
FIG. 10 are images for describing an improved quality of an MR image generated by the MRI apparatus and the MR imaging method according to an embodiment or another embodiment of the present invention.

FIG. 10 is diagrams for describing an improved quality of an MR image generated by the MRI apparatus and method according to an embodiment or another embodiment of the present invention.

A region 1010 of FIG. 10 shows a final MR image 1012 and under-sampled K-space data 1011 acquired by setting the same under-sampling interval pattern for each block.

A region 1020 of FIG. 10 shows a final MR image 1022 and under-sampled K-space data 1021 acquired by less densely setting an under-sampling interval pattern of at least one block included in an outer region of a K-space.

A region 1030 of FIG. 10 shows a final MR image 1032 and under-sampled K-space data 1031 acquired by more densely setting an under-sampling interval pattern of a block disposed in a center region of the K-space.

A region 1040 of FIG. 10 shows a final MR image 1042 and under-sampled K-space data 1041 acquired by more densely setting under-sampling interval patterns of four blocks disposed in the center region of the K-space.

Comparing the final MR images 1012, 1022, 1032, and 1042 of FIG. 10, aliasing artifacts existing in a final MR image are more reduced by more densely setting under-sampling interval patterns of blocks disposed in a low-frequency domain of the K-space than those of blocks disposed in the other domain.

Moreover, in K-space data, a quality of an image may be adjusted by adjusting a size of a region or a block in which an under-sampling interval pattern is more densely set. For example, a quality of an image is more enhanced by increasing a size of a region or a block in which an under-sampling interval pattern is more densely set. Also, a quality of an image is degraded by decreasing a size of a region or a block in which an under-sampling interval pattern is more densely set. A quality of an image may be adjusted by differently setting a non-uniform under-sampling pattern depending on a part of an object to be photographed. Also, in adjusting a quality of an image, a non-uniform under-sampling pattern which is experimentally optimized is acquired for each part of an object to be photographed, thereby enhancing a quality of an image.

Figure 11:
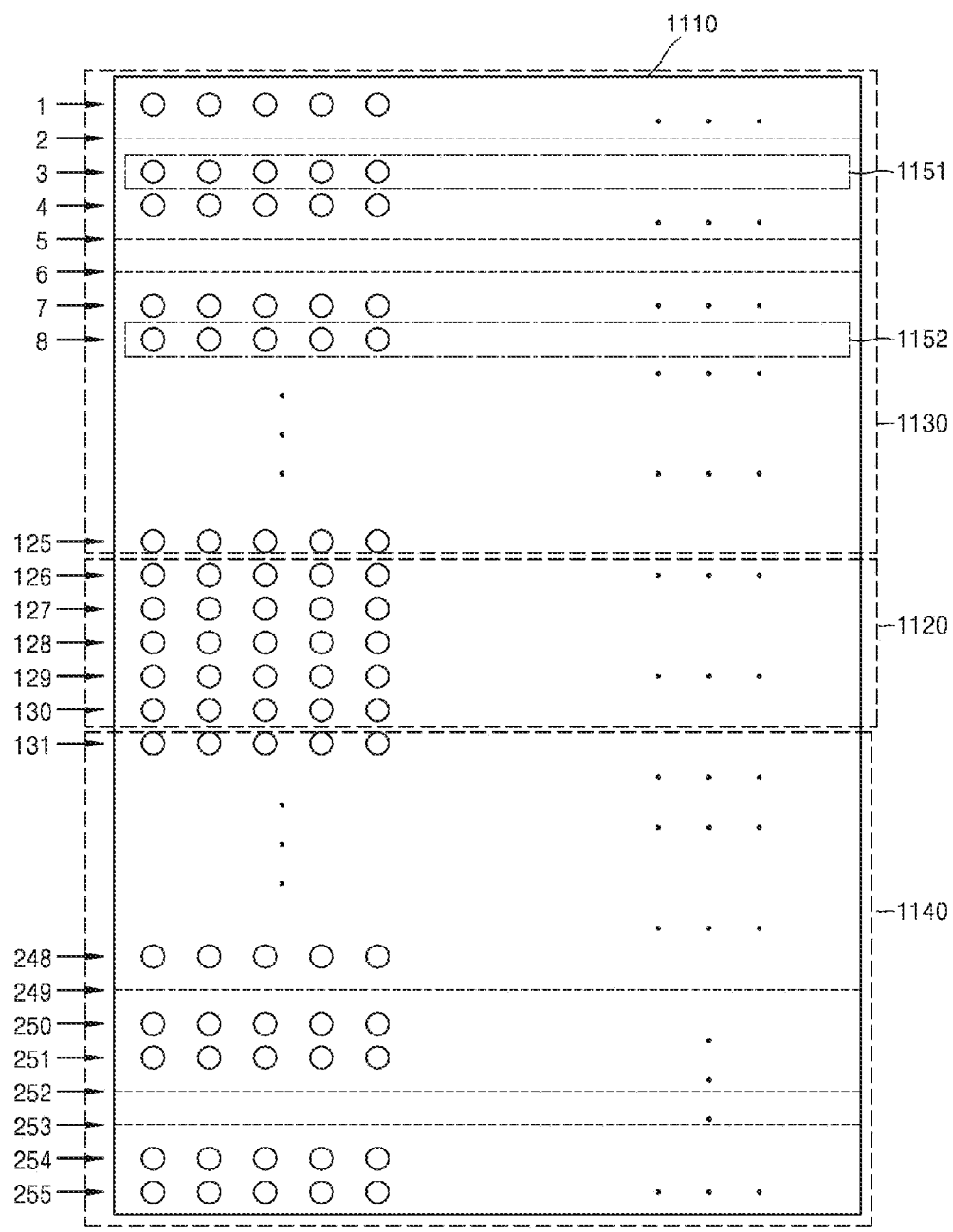
FIG. 11 is a diagram for describing an MRI apparatus according to another embodiment of the present invention.

FIG. 11 is a diagram for describing an MRI apparatus 200 according to another embodiment of the present invention.

In the MRI apparatus 200, the data acquirer 210 performs under-sampling on MR signals, respectively received from the plurality of channel coils included in the RF multi-coil 205, at non-uniform intervals in a whole K-space corresponding to a channel coil to acquire a plurality of pieces of line data.

The image processor 230 may restore a plurality of pieces of K-space data respectively corresponding to the plurality of channel coils on the basis of a spatial correlation coefficient which is calculated by using at least one of a plurality of pieces of line data acquired in a center region of a K-space and at least one of a plurality of pieces of line data acquired in a peripheral region of the K-space.

Referring to FIG. 11, the data acquirer 210 may perform under-sampling at non-uniform intervals to acquire K-space data 1110 in a K-space corresponding to a channel coil. The under-sampled K-space data 1110, as illustrated, is obtained by performing under-sampling at overall non-uniform intervals when a center region 1120 and peripheral regions 1130 and 1140 are set to have different under-sampling intervals.

The data acquirer 210 may divide a K-space into a plurality of blocks, and set, as a calibration block, a first block which is disposed in a center region of the K-space. In detail, the data acquirer 210 may set, as a calibration block 1120, a first block 1120 including n number of lines with respect to a center line of the K-space. For example, when the K-space includes 256 lines, the center line is a 128th line, and as an example, FIG. 11 illustrates a case in which the calibration block 1120 includes five lines disposed adjacent to the 128th line that is the center line.

Moreover, FIG. 11 illustrates, for example, a case in which the K-space is divided into three blocks. However, the K-space may be divided into three or more blocks, which may be set to have different under-sampling interval patterns.

The data acquirer 210 may perform sampling on all lines in the calibration block 1120 to acquire a plurality of pieces of calibration line data. The data acquirer 210 may perform under-sampling at first intervals to acquire a plurality of pieces of first line data in the K-space, and may additionally perform sampling on at least one second line to further acquire at least one piece of second line data in the second blocks 1130 and 1140 disposed in the peripheral region of the K-space. FIG. 11 illustrates, for example, a case in which when a K-space corresponding to a channel coil is divided into a plurality of blocks, and a block disposed in a center region of the K-space is distinguished from a block disposed in a region other than the center region of the K-space. That is, the first block 1120 disposed in the center region of the K-space and the second blocks 1130 and 1140 disposed in a region other than the center region of the K-space may be included in the K-space corresponding to the channel coil.

In detail, the data acquirer 210 may perform sampling on 126 to 130 lines (which are all lines included in the calibration block 1120) to acquire a plurality of pieces of calibration line data. The data acquirer 210 may perform under-sampling on the K-space at three-line intervals, namely, perform under-sampling of an MR signal for each of first, fourth, seventh, . . . , 3n+1st lines, to acquire a plurality of pieces of first line data. The data acquirer 210 may additionally perform under-sampling on a third or eighth line, which is at least one line included in the peripheral regions 1130 and 1140 of the K-space, to acquire pieces of second line data 1151 and 1152.

The image processor 230 may acquire a spatial correlation coefficient by using the plurality of pieces of calibration line data, the plurality of pieces of first line data, and the at least one piece of second line data.

In detail, in the example of FIG. 11, the image processor 230 may acquire the spatial correlation coefficient by using the plurality of pieces of line data (the calibration line data) included in the block 1120, the plurality of pieces of first line data (which are acquired by performing under-sampling of the MR signal for each of the first, fourth, seventh, . . . , 3n+1st lines), and the pieces of second line data 1151 and 1152 which are acquired by additionally performing under-sampling on the third or eighth line included in the peripheral regions 1130 and 1140 of the K-space. The image processor 230 may perform calibration by using the acquired spatial correlation coefficient to restore a plurality of pieces of unacquired line data in the K-space.

Figure 12:
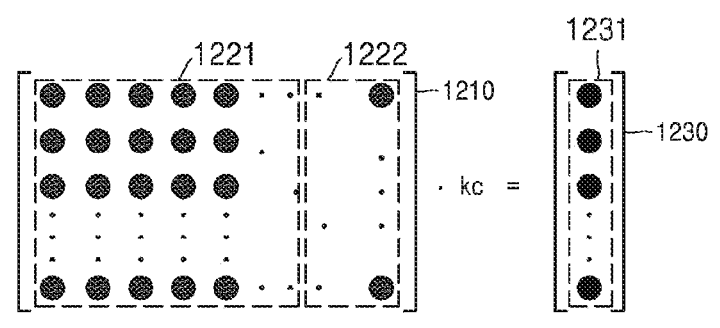

FIG. 12 is a diagram for describing an operation of acquiring a spatial correlation coefficient in the MRI apparatus according to another embodiment of the present invention.

In acquiring a spatial correlation coefficient for performing calibration, the image processor 230 may use a matrix operation similarly to FIG. 4A.

A left term 1210 of the matrix operation is composed of signal values of a plurality of pieces of acquired line data, in under-sampled K-space data. A right term 1230 of the matrix operation is composed of signal values of calibration lines included in a calibration block, in the under-sampled K-space data.

Moreover, the left term 1210 of the matrix operation may be composed of signal values 1221 of a plurality of pieces of line data, which are acquired by performing under-sampling on the K-space overall, and signal values 1222 of at least one of a plurality of pieces of line data acquired in a peripheral region of the K-space. The right term 1230 may be composed of signal values 1231 of a plurality of pieces of calibration line data acquired in a calibration block 1120. The image processor 230 may perform an inverse operation of the matrix operation illustrated in FIG. 12 to calculate a spatial correlation coefficient Kc.

By using the calculated spatial correlation coefficient Kc, the image processor 230 may restore a plurality of pieces of unacquired line data in the K-space to the restored plurality of pieces of line data.

As described above, according to the one or more embodiments of the present invention, the MRI apparatus and method improve a quality of a restored MR image. In more detail, by acquiring K-space data through under-sampling performed at non-uniform under-sampling intervals, the MRI apparatus and method prevent a quality of an image from being degraded due to aliasing artifacts, thus improving a quality of a restored MR image.

Moreover, according to the one or more embodiments of the present invention, the MRI apparatus and method acquire K-space data through under-sampling, thus quickly acquiring an MR image. Also, the MRI apparatus and method quickly acquire an MR image with an improved quality even without using an additional calibration signal used in a GRAPPA technique or using a coil sensitivity map that has additional coil information and is used in a SMASH technique.

Moreover, the MRI apparatus and the imaging method for the MRI apparatus according to one embodiment or another embodiment of the present invention under-samples a K-space in units of a block, and thus have a merit in restoring an image in a low frequency domain and a high frequency domain which correspond to an entire region of the K-space.

The above-described embodiments may be written as computer programs and may be implemented in general-use digital computers that execute the programs using computer-readable recording media.

Examples of the computer-readable recording medium include magnetic storage media (e.g., ROM, floppy disks, hard disks, etc.) and optical recording media (e.g., CD-ROMs or DVDs).

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A magnetic resonance imaging (MRI) apparatus comprising:
a data acquirer configured to under-sample MR signals, respectively received from channel coils included in a radio frequency (RF) multi-coil, at non-uniform intervals to acquire fully sampled lines comprising pieces of line data; and
an image processor configured to restore pieces of K-space data respectively corresponding to the channel coils by using a positional relationship based on a spatial distance between a reference line data set from among the acquired pieces of line data of the fully sampled lines and at least two of the acquired pieces of line data of the fully sampled lines, in a K-space.

2. The MRI apparatus of claim 1, wherein the data acquirer is configured to under-sample the MR signals at the non-uniform intervals in an entire K-space corresponding to one of the channel coils.

3. A magnetic resonance imaging (MRI) apparatus comprising:
a data acquirer configured to under-sample MR signals, respectively received from channel coils included in a radio frequency (RF) multi-coil, at non-uniform intervals to acquire pieces of line data; and
an image processor that restores pieces of K-space data respectively corresponding to the channel coils by using a relationship between the acquired pieces of line data,
wherein the data acquirer is configured to divide the K-space corresponding to each of the channel coils into blocks, and under-sample the MR signals for corresponding blocks at the non-uniform intervals to acquire the pieces of line data.

4. The MRI apparatus of claim 3, wherein the data acquirer is configured to apply a same non-uniform under-sampling pattern to the corresponding blocks, to acquire the pieces of line data.

5. The MRI apparatus of claim 3, wherein the image processor is configured to restore pieces of unacquired line data, by using the relationship between the acquired pieces of line data, and restore the K-space data corresponding to one of the channel coils,
by using at least one of the restored pieces of unacquired line data and the acquired pieces of line data.

6. The MRI apparatus of claim 5, wherein the image processor is configured to set one of the acquired pieces of line data as the reference line data, and determine the relationship, as a first relationship, based on spatial distances between the reference line data and the at least two pieces of the acquired pieces of line data.

7. The MRI apparatus of claim 6, wherein the image processor is configured to restore one of the pieces of unacquired line data having the first relationship with the at least two pieces of the acquired pieces of line data, and restore another one of the pieces of unacquired line data having the first relationship with at least one of the restored pieces of line data and at least one of the acquired pieces of line data.

8. The MRI apparatus of claim 6, wherein the image processor is configured to calculate a spatial correlation coefficient corresponding to the first relationship, by using the reference line data and the at least two pieces of the acquired pieces of line data, and to restore the pieces of unacquired line data by using the calculated spatial correlation coefficient.

9. The MRI apparatus of claim 5, wherein the image processor is configured to sequentially restore the pieces of unacquired line data, included in each of the blocks, in a predetermined order.

10. The MRI apparatus of claim 3, wherein the data acquirer is configured to apply different non-uniform under-sampling patterns to the corresponding blocks, to acquire the pieces of line data.

11. The MRI apparatus of claim 3, wherein the blocks are divided into groups, and
the groups comprise different under-sampling interval patterns.

12. The MRI apparatus of claim 3, wherein the blocks comprise a first block and a second block, and
the first and second blocks comprise under-sampling interval patterns different from one another.

13. The MRI apparatus of claim 12, wherein the first block comprises more or fewer pieces of the acquired pieces of line data than the second block.

14. The MRI apparatus of claim 3, wherein the blocks comprise a first block, a second block, and a third block,
the second block comprises fewer pieces of the acquired pieces of line data than the first block, and
the third block comprises more pieces of the acquired pieces of line data than the first block.

15. The MRI apparatus of claim 14, wherein the third block is disposed closer to a center line of the K-space than the first and second blocks.

16. The MRI apparatus of claim 1, wherein the image processor is configured to calculate a spatial transform on the restored pieces of K-space data to generate MR images by channel, and acquire a final MR image by using the MR images by channel.

17. The MRI apparatus of claim 16, wherein the image processor is configured to calculate an inverse Fourier transform on the restored pieces of K-space data to generate the MR images by channel.

18. The MRI apparatus of claim 16, wherein the image processor is configured to calculate a sum of squares or a complex sum of the MR images by channel to generate the final MR image.

19. The MRI apparatus of claim 3, wherein a number of the blocks and sizes of the blocks are set based on at least one of a hardware type of the RF multi-coil and a region of an object to be imaged.

20. The MRI apparatus of claim 3, wherein the data acquirer is configured to apply a non-uniform under-sampling pattern, to acquire the pieces of line data, which is set based on at least one of a hardware type of the RF multi-coil and a region of an object to be imaged.

21. A magnetic resonance imaging (MRI) apparatus comprising:
a data acquirer configured to under-sample MR signals, respectively received from channel coils included in a radio frequency (RF) multi-coil, at non-uniform intervals in an entire K-space corresponding to one of the channel coils to acquire fully sampled lines comprising pieces of line data; and
an image processor configured to restore pieces of K-space data respectively corresponding to the channel coils based on a spatial correlation coefficient which is calculated by using at least one of the pieces of line data of the fully sampled line acquired in a center region of the K-space and at least one of the pieces of line data of the fully sampled line acquired in a peripheral region of the K-space, and
wherein the image processor calculates the spatial correlation coefficient by using a positional relationship based on a spatial distance between a reference line data set from among the at least one of the pieces of line data acquired in the center region of the K-space and the peripheral region of the K-space and at least two of the acquired pieces of line data acquired in the center region of the K-space and the peripheral region of the K-space.

22. A magnetic resonance imaging (MRI) apparatus comprising:
a data acquirer configured to under-sample MR signals, respectively received from channel coils included in a radio frequency (RF) multi-coil, at non-uniform intervals in an entire K-space corresponding to one of the channel coils to acquire pieces of line data; and
an image processor configured to restore pieces of K-space data respectively corresponding to the channel coils based on a spatial correlation coefficient which is calculated by using at least one of the pieces of line data acquired in a center region of the K-space and at least one of the pieces of line data acquired in a peripheral region of the K-space,
wherein the data acquirer is configured to divide the K-space into blocks, and set, as a calibration block, a first block which is disposed in the center region of the K-space.

23. The MRI apparatus of claim 22, wherein the data acquirer is configured to sample all lines in the calibration block, to acquire pieces of calibration line data, to under-sample the MR signals at first intervals to acquire pieces of first line data in the entire K-space, and to additionally sample at least one second line to further acquire at least one piece of second line data in a second block disposed in the peripheral region of the K-space.

24. The MRI apparatus of claim 23, wherein the image processor is configured to acquire the spatial correlation coefficient by using the pieces of calibration line data, the pieces of first line data, and the at least one piece of second line data.

25. A magnetic resonance imaging (MRI) apparatus comprising:
a data acquirer configured to under-sample MR signals, which are respectively received from channel coils included in a radio frequency (RF) multi-coil, at non-uniform intervals in an entire K-space of corresponding channel coils to acquire fully sampled lines comprising pieces of line data; and
an image processor configured to restore complete K-space data corresponding to each of the channel coils by using a K-space positional relationship based on a spatial distance between a reference line data set from among the pieces of line data of the fully sampled lines and at least two of the pieces of line data of the fully sampled lines, which are acquired by under-sampling at the non-uniform intervals.

26. A magnetic resonance (MR) imaging method using a radio frequency (RF) multi-coil including channel coils, the method comprising:

under-sampling MR signals, respectively received from the channel coils, at non-uniform intervals to acquire fully sampled lines comprising pieces of line data; and restoring pieces of K-space data respectively corresponding to the channel coils by using a positional relationship based on a spatial distance between a reference line data set from among the acquired pieces of line data of fully sampled lines and at least two of the acquired pieces of line data of the fully sampled lines, in a K-space.

27. The method of claim 26, wherein the under-sampling comprises:

under-sampling the MR signals at the non-uniform intervals in an entire K-space of corresponding channel coils to acquire the pieces of line data.

28. A magnetic resonance (MR) imaging method comprising:

under-sampling MR signals, respectively received from the channel coils, at non-uniform intervals to acquire pieces of line data; and restoring pieces of K-space data respectively corresponding to the channel coils by using a relationship between the acquired pieces of line data, wherein the under-sampling comprises:

dividing the K-space of the corresponding channel coils into blocks; and under-sampling the MR signals for the blocks at the non-uniform intervals to acquire the of pieces of line data.

29. The method of claim 28, wherein the under-sampling further comprises:

applying a same non-uniform under-sampling pattern to the corresponding blocks.

30. The method of claim 28, wherein the restoring the pieces of K-space data comprises:

restoring pieces of unacquired line data by using the relationship between the acquired pieces of line data; and restoring K-space data corresponding to one of the channel coils by using one of the restored pieces of line data and the acquired pieces of line data.

* * * * *